(12) United States Patent
Ho et al.

(10) Patent No.: US 10,707,219 B2
(45) Date of Patent: Jul. 7, 2020

(54) SEMICONDUCTOR INTEGRATED CIRCUIT

(71) Applicant: KABUSHIKI KAISHA TOSHIBA, Minato-ku (JP)

(72) Inventors: Yinghao Ho, Kawasaki (JP); Masato Oda, Yokohama (JP); Shinichi Yasuda, Setagaya (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 16/296,780

(22) Filed: Mar. 8, 2019

(65) Prior Publication Data

US 2020/0083235 A1    Mar. 12, 2020

(30) Foreign Application Priority Data

Sep. 12, 2018  (JP) .................................. 2018-170713

(51) Int. Cl.
| | |
|---|---|
| *G11C 11/16* | (2006.01) |
| *H01L 27/112* | (2006.01) |
| *H03K 19/20* | (2006.01) |
| *H03K 19/177* | (2020.01) |
| *G11C 17/18* | (2006.01) |

(52) U.S. Cl.
CPC ........ *H01L 27/11206* (2013.01); *G11C 17/18* (2013.01); *H03K 19/177* (2013.01); *H03K 19/20* (2013.01)

(58) Field of Classification Search
CPC .................................................. G11C 11/1673
USPC ........................................................... 365/158
See application file for complete search history.

(56) References Cited

U.S. PATENT DOCUMENTS

| | | | |
|---|---|---|---|
| 9,264,044 B2 | 2/2016 | Yasuda et al. | |
| 2003/0123281 A1* | 7/2003 | Iwata .................. | G11C 11/1673 365/158 |
| 2018/0151225 A1 | 5/2018 | Ho et al. | |

\* cited by examiner

*Primary Examiner* — Jason Lappas
(74) *Attorney, Agent, or Firm* — Oblon, McClelland, Maier & Neustadt, L.L.P.

(57) ABSTRACT

A semiconductor integrated circuit of an embodiment includes: first to fifth wiring lines; a first OTP memory element including a first and second terminals connected to the first and second wiring lines; a first p-channel transistor including a source and drain terminals connected to the first and third wiring line, and a gate terminal receiving a first control signal; a first n-channel transistor including a source and drain terminals connected to the first and fourth wiring lines, and a gate terminal receiving a second control signal; a second p-channel transistor including a source and drain terminals connected to the second and third wiring lines, and a gate terminal receiving a third control signal; and a second n-channel transistor including a source and drain terminals connected to the second and fifth wiring lines, and a gate terminal receiving a fourth control signal.

14 Claims, 17 Drawing Sheets

|  | DATA WRITING IN ROW DIRECTION | DATA WRITING IN COLUMN DIRECTION | NORMAL OPERATION |
|---|---|---|---|
| Vprg | Vprg1 | Vprg2 | 0V |
| Vbst | Vhv | Vhv | Vhv |
| $VR_i$ (i=1,2) | 0V | 0V/Vdd | 0V |
| $Rselect_i$ (i=1,2) | 0V/Vprg1 | Vprg2 | Vhv |
| $VC_j$ (j=1,2) | 0V/Vdd | 0V | 0V |
| $Cselect_j$ (j=1,2) | Vprg1 | 0V/Vprg2 | Vhv |
| R_En | 0V | Vhv | 0V |
| C_En | Vhv | 0V | Vhv |
| $EN_1$ | 0V | 0V | Vdd |
| $In_1$ | 0V | 0V | $In_1$ |
| $In_2$ | 0V | 0V | $In_2$ |

FIG. 9

|  | DATA WRITING IN ROW DIRECTION | DATA WRITING IN COLUMN DIRECTION | NORMAL OPERATION |
|---|---|---|---|
| $EN_2$ | Vdd | Vdd | Vdd |
| $EN_3$ | Vdd | 0V | 0V |

|  | DATA WRITING IN ROW DIRECTION | DATA WRITING IN COLUMN DIRECTION | NORMAL OPERATION |
|---|---|---|---|
| Vhvn | -Vnprg | -Vnprg | 0 |
| Vhvp | Vpprg | Vpprg | Vpprg |
| $Rp_i$ (i=1,2) | 0V/Vpprg | Vpprg | Vpprg |
| $Rn_i$ (i=1,2) | -Vnprg | 0V/-Vnprg | 0 |
| $C_j$ (j=1,2) | 0V/Vdd | Vdd/0V | 0V |
| $WEn_1$ | 0V | 0V | Vdd |
| $WEn_2$ | 0V | 0V | Vdd |
| $In_1$ | 0V | 0V | $In_1$ |
| $In_2$ | 0V | 0V | $In_2$ |

SEMICONDUCTOR INTEGRATED CIRCUIT

CROSS REFERENCE TO RELATED APPLICATIONS

This application is based upon and claims the benefit of priority from the prior Japanese Patent Application No. 2018-170713, filed on Sep. 12, 2018, the entire contents of which are incorporated herein by reference.

FIELD

Embodiments described herein relate generally to semiconductor integrated circuits.

BACKGROUND

Programmable logic devices are semiconductor integrated circuits, data of which may be rewritten after the manufacture of chips. The programmable logic devices are used in such circuits as field programmable gate arrays (FPGA), which may need to be reconfigured with respect to arithmetic processing circuits and wiring circuits. A programmable logic device includes multiple wiring lines, two of which are selected to be electrically connected or disconnected. A switching circuit is used to control the connection or disconnection of the selected two wiring lines. The switching circuit includes a memory such as a nonvolatile memory using nonvolatile memory elements, for example one time programmable (OTP) memory elements, as storage elements. The nonvolatile memory has a crossbar array structure, for example, and includes a first wiring line, a second wiring line crossing the first wiring line, and a nonvolatile memory element disposed to an intersection region of the first wiring line and the second wiring line. The nonvolatile memory element may be a transistor having a two-terminal configuration, in which a source terminal and a drain terminal are electrically connected to each other, and the source and drain terminals are connected to the first wiring line, and a gate terminal is connected to the second wiring line.

The transistor having the two-terminal configuration may be brought into a low resistance state by applying a voltage between the gate terminal and the source and drain terminals to break the gate insulating film. Using the transistor with the two-terminal configuration as the OTP memory element may arise a problem of a delay in operation speed of the FPGA, as will be described later.

BRIEF DESCRIPTION OF THE DRAWINGS

FIG. 9 is a diagram illustrating an example of voltages of the respective signals in the write operation performed in the row direction, the write operation performed in the column direction, and the normal operation in the semiconductor integrated circuit according to the example of the first embodiment.
FIG. 18 is a diagram illustrating an example of voltages of the respective signals in the write operation performed in the row direction, the write operation performed in the column direction, and the normal operation in the semiconductor integrated circuit according to the example of the second embodiment.

DETAILED DESCRIPTION

Before the embodiments of the present invention are described, how the present invention is made will be described.

Figure 1:
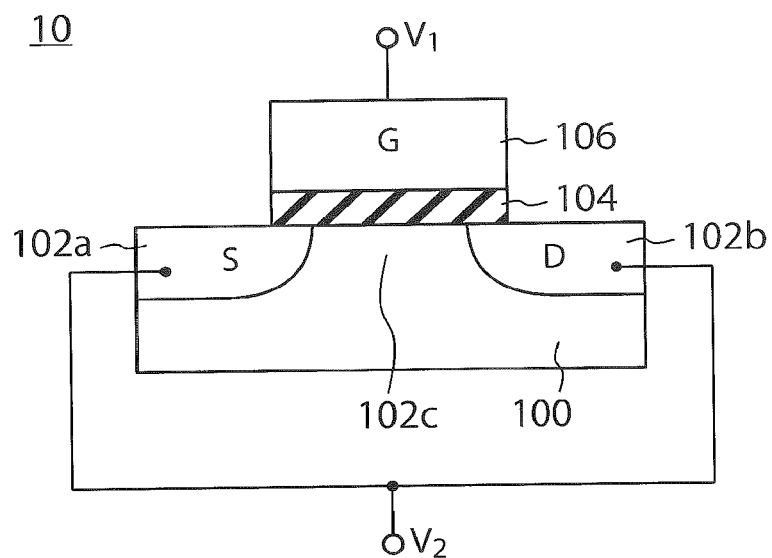
FIG. 1 is a cross-sectional view of a transistor having a two-terminal configuration.

The inventors of the present invention performed an experiment to measure the resistance of a transistor having a two-terminal configuration used as an OTP memory element, after the gate insulating film of the transistor is broken in order to prevent the delay in operation speed. As shown in FIG. 1, a transistor having a two-terminal configuration 10 has a source region (source terminal S) 102a and a drain region (drain terminal D) 102b that are spaced from each other in a semiconductor layer 100, a gate insulating film 104 disposed on the semiconductor layer 100 between the source region 102a and the drain region 102b, and a gate electrode (gate terminal G) 106 disposed on the gate insulating film 104. The source terminal 102*a* and the drain terminal 102*b* are electrically connected with each other.

Figure 2:
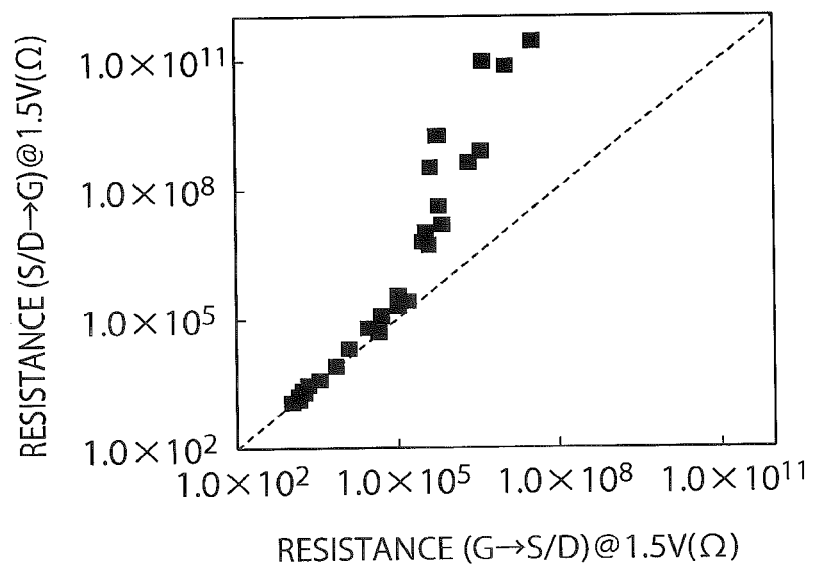
FIG. 2 is a diagram illustrating a result of measurement of the resistance values of the transistor having the two-terminal configuration.

A plurality of transistors 10 are prepared. The gate insulating film of each transistor is broken by applying a voltage between the gate terminal G, and the source terminal S and the drain terminal D. The potential applied to the gate terminal G is set to be higher than the potential applied to the source terminal S and the drain terminal D to break the gate insulating film. Thereafter, a voltage of 1.5 V, for example, is applied between the gate terminal G and the source terminal S and the drain terminal D of each transistor 10, and the resistance of each transistor 10 is measured. FIG. 2 shows the measurement result. In FIG. 2, the horizontal axis represents measured values of the resistance of each transistor 10 when a potential V1 applied to the gate terminal G is higher than a potential V2 applied to the source terminal S and the drain terminal D, and the vertical axis represents measured values of the resistance of each transistor 10 when the potential V1 applied to the gate terminal G is lower than the potential V2 applied to the source terminal S and the drain terminal D. Here, |V1−V2|=1.5 V.

As can be understood from FIG. 2, if the resistance value of the transistor 10 is in a low range, for example up to around $1.0 \times 10^5$ (Ω), the resistance value when a current is caused to flow from the gate terminal G to the source terminal S and the drain terminal D is not substantially different from the resistance value when a current is caused to flow from the source terminal S and the drain terminal D to the gate terminal G. However, if the resistance value of the transistor 10 is greater than $1.0 \times 10^5$ (Ω), the resistance value when a current is caused to flow from the source terminal S and the drain terminal D to the gate terminal G is greater by one to four order than the resistance value when a current is caused to flow from the gate terminal G to the source terminal S and the drain terminal D. Thus, the transistor having the two-terminal configuration has a (rectifying) characteristic that if the resistance value is in a high range, the resistance value may change depending on the direction of the current.

Figure 3:
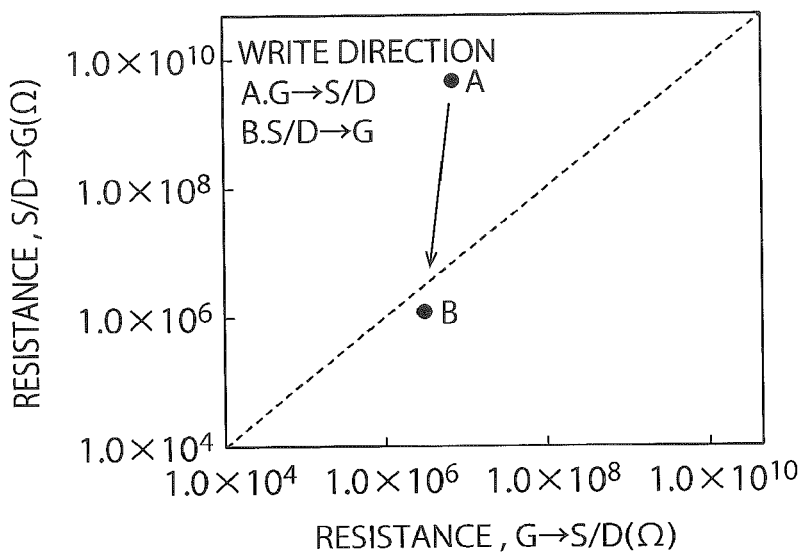
FIG. 3 is a diagram illustrating a result of measurement of the resistance value of the transistor having the two-terminal configuration when an additional write operation is performed on the transistor with the writing direction being changed.

The inventors further performed an additional write operation on the transistor 10 having the rectifying characteristic, with the writing direction being changed, and measured the degree of rectification of the transistor 10. During the first write operation, a high potential is applied to the gate terminal G, and a low potential is applied to the source terminal S and the drain terminal D. A point A in FIG. 3 indicates the result of the measurement of the rectification. Thereafter, a high potential is applied to the source terminal S and the drain terminal D, and a low potential is applied to the gate terminal, and an additional write operation is performed. A point B in FIG. 3 indicates the result of the measurement of the rectification in this case. As can be understood from FIG. 3, the additional write operation makes the measured resistance value substantially the same regardless of the direction of read current. Thus, the rectifying characteristic is curbed.

From the foregoing, the inventors came to consider that the delay in the operation of an FPGA including transistors having a two-terminal configuration as OTP (one time programmable) memory elements is caused by the rectifying characteristic of the transistor. The inventors further considered that if an additional write operation with the writing direction being changed is performed on the OTP memory elements, the rectifying characteristic may be curbed. Embodiments of a semiconductor integrated circuit that achieves this will be described below.

A semiconductor integrated circuit according to an embodiment includes: first to fifth wiring lines; a first OTP memory element including a first terminal connected to the first wiring line and a second terminal connected to the second wiring line; a first p-channel transistor including a source terminal and a drain terminal, one of which is connected to the first wiring line and the other of which is connected to the third wiring line, and a gate terminal, which receives a first control signal; a first n-channel transistor including a source terminal and a drain terminal, one of which is connected to the first wiring line and the other of which is connected to the fourth wiring line, and a gate terminal, which receives a second control signal; a second p-channel transistor including a source terminal and a drain terminal, one of which is connected to the second wiring line and the other of which is connected to the third wiring line, and a gate terminal, which receives a third control signal; and a second n-channel transistor including a source terminal and a drain terminal, one of which is connected to the second wiring line and the other of which is connected to the fifth wiring line, and a gate terminal, which receives a fourth control signal.

First Embodiment

Figure 4:
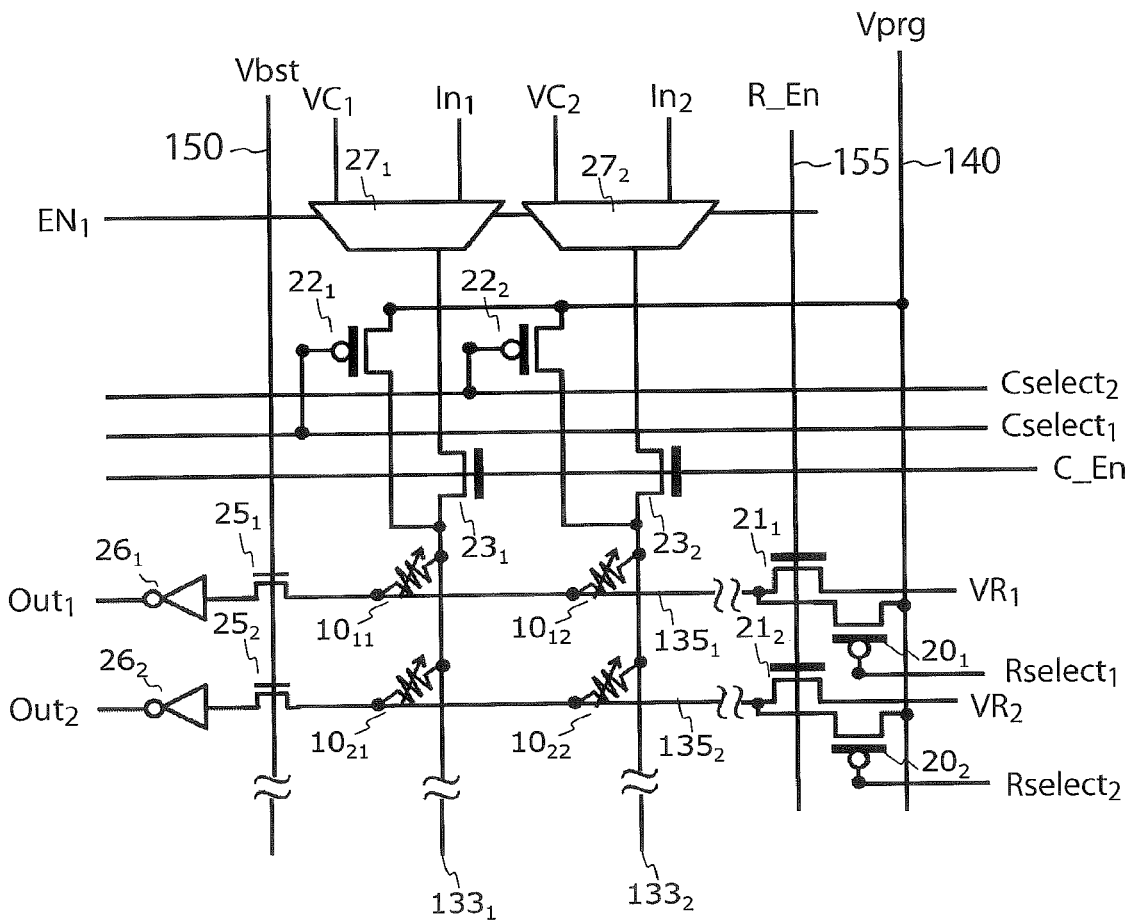
FIG. 4 is a circuit diagram of a semiconductor integrated circuit according to a first embodiment.

FIG. 4 shows a semiconductor integrated circuit according to a first embodiment. The semiconductor integrated circuit according to the first embodiment is used in an FPGA, for example, and includes wiring lines $133_1$ and $133_2$, wiring lines $135_1$ and $135_2$, and OTP memory elements (also referred to as "memory elements") $10_{11}$, $10_{12}$, $10_{21}$, and $10_{22}$ arranged in an array form. The wiring lines $135_1$ and $135_2$ intersect with the wiring lines $133_1$ and $133_2$. A memory element $10_{ij}$ is disposed to an intersection region of the wiring line $133_j$ (i, j=1, 2) and the wiring line $135_{ij}$. The memory element $10_{ij}$ (i, j=1, 2) has a two-terminal configuration with a first terminal and a second terminal, the first terminal being connected to the corresponding wiring line $133_j$, and the second terminal being connected to the corresponding wiring line $135_i$.

The semiconductor integrated circuit according to the first embodiment further includes p-channel MOS transistors ("p-channel transistors") $20_1$ and $20_2$, n-channel MOS transistors ("n-channel transistors") $21_1$ and $21_2$, p-channel transistors $22_1$ and $22_2$, n-channel transistors $23_1$ and $23_2$, n-channel transistors $25_1$ and $25_2$, inverters $26_1$ and $26_2$, and selection circuits (multiplexers) $27_1$ and $27_2$. The p-channel transistors $20_1$ and $20_2$, the n-channel transistors $21_1$ and $21_2$, the p-channel transistors $22_1$ and $22_2$, and the n-channel transistors $23_1$ and $23_2$ are high breakdown voltage transistors with gate insulating films that are thicker than the gate insulating films of the n-channel transistors $25_1$ and $25_2$.

The drain terminal of the p-channel transistor $20_i$ (i=1, 2) and the source terminal of the n-channel transistor $21_i$ are connected to one end of the wiring line $135_i$. The drain terminal of the n-channel transistor $25_i$ (i=1, 2) is connected to the other end of the wiring line $135_i$. Thus, the n-channel transistor $25_i$ (i=1, 2) is positioned opposite to the p-channel transistor $20_i$ and the n-channel transistor $21_i$ with the memory elements $10_{i1}$ and $10_{i2}$ located therebetween. The source terminal of the p-channel transistor $20_i$ (i=1, 2) is connected to a wiring line 140 to which a write voltage Vprg is applied. A signal $Rselect_i$ for selecting the wiring line $135_i$ is supplied to the gate terminal of the p-channel transistor $20_i$ (i=1, 2). A voltage $VR_i$ is applied to the drain terminal of the n-channel transistor $21_i$ (i=1, 2). The gate terminal of the n-channel transistor $21_i$ is connected to a wiring line 155, to which a signal R_En for performing a write operation in a row direction on one of the memory element $10_{i1}$ and the memory element $10_{i2}$ is supplied. The gate terminal of the n-channel transistor $25_i$ (i=1, 2) is connected to a wiring line 150, to which a signal Vbst is applied, and the source terminal is connected to the input terminal of the inverter $26_i$. An output signal $Out_i$ is outputted from the output terminal of the inverter $26_i$ (i=1, 2).

The selection circuit $27_j$ (j=1, 2) has two input terminals and one output terminal, selects one of a signal $VC_j$ and a signal $In_j$ inputted to the two input terminals according to an enable signal $EN_1$, and outputs the selected signal from the output terminal. Thus, the selection circuit $27_j$ (j=1, 2) electrically connects one of the two input terminals and the output terminal according to the enable signal $EN_1$. Electrically connecting A and B herein means that A and B may be connected directly or via a conducting material disposed between A and B. The source terminal of the p-channel transistor $22_j$ (j=1, 2) is connected to the wiring line 140. A signal $Cselect_j$ for selecting the wiring line $133_j$ is supplied to the gate terminal of the p-channel transistor $22_j$. The drain terminal of the p-channel transistor $22_j$ is connected to the wiring line $133_j$. The drain terminal of the n-channel transistor $23_j$ (j=1, 2) is connected to the output terminal of the selection circuit $27_j$, the gate terminal receives a signal C_En for performing a write operation on one of the memory element $10_{1j}$ and the memory element $10_{2j}$ arranged in a column direction, and the source terminal is connected to the wiring line $133_j$.

Figure 5:
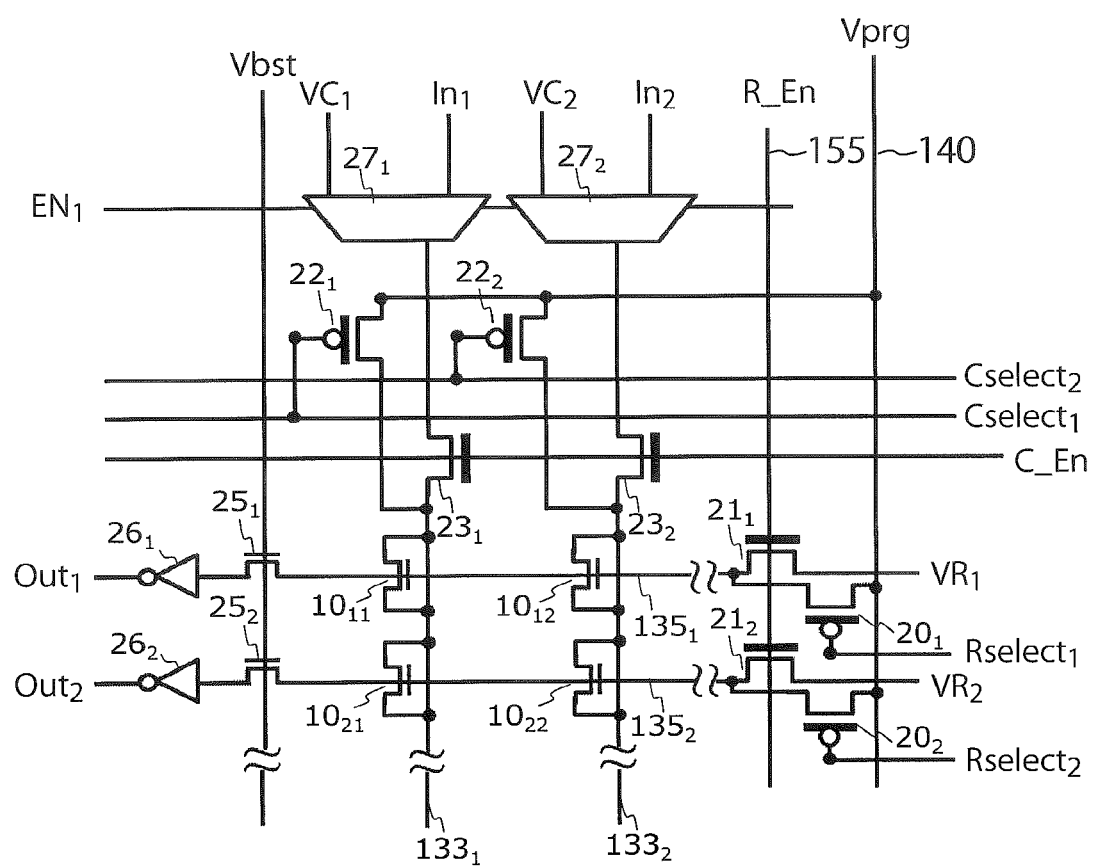
FIG. 5 is a circuit diagram of a semiconductor integrated circuit according to an example of the first embodiment.

FIG. 5 shows an example in which the transistor having a two-terminal configuration 10 shown in FIG. 1 is used as each memory element $10_{ij}$ (i, j=1, 2) of the semiconductor integrated circuit according to the first embodiment shown in FIG. 4. In FIG. 5, the gate terminal of the memory element $10_{ij}$ (i, j=1, 2) is connected to the wiring line $135_i$, and the source terminal and the drain terminal are connected to the wiring line $133_j$. The gate terminal of the memory element $10_{ij}$ (i, j=1, 2) may be connected to the wiring line $133_i$, and the source terminal and the drain terminal may be connected to the wiring line $135_j$, although no drawing is provided.

(Write Operation)

Figure 6:
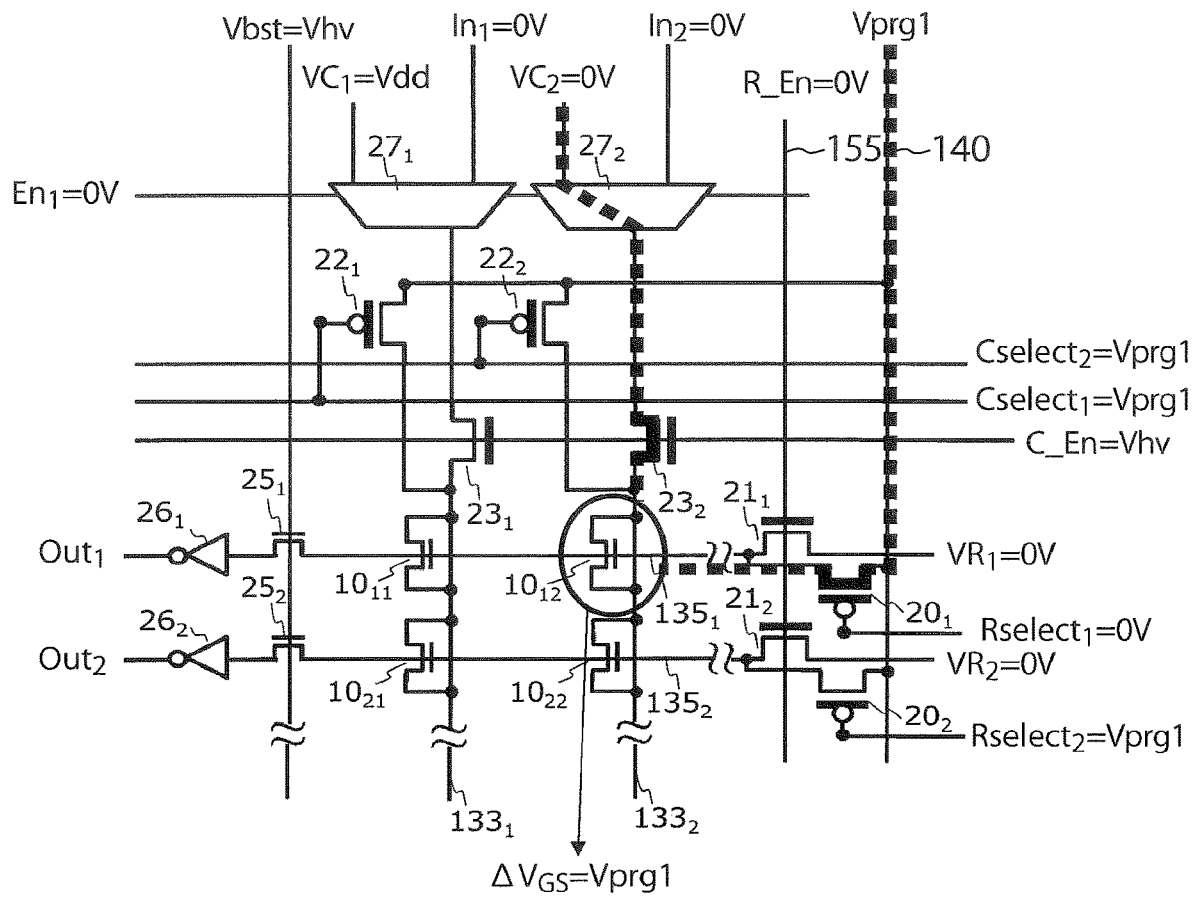
FIG. 6 is a circuit diagram illustrating an example of a write operation performed in a row direction on a memory element of the semiconductor integrated circuit according to the example of the first embodiment.
Figure 7:
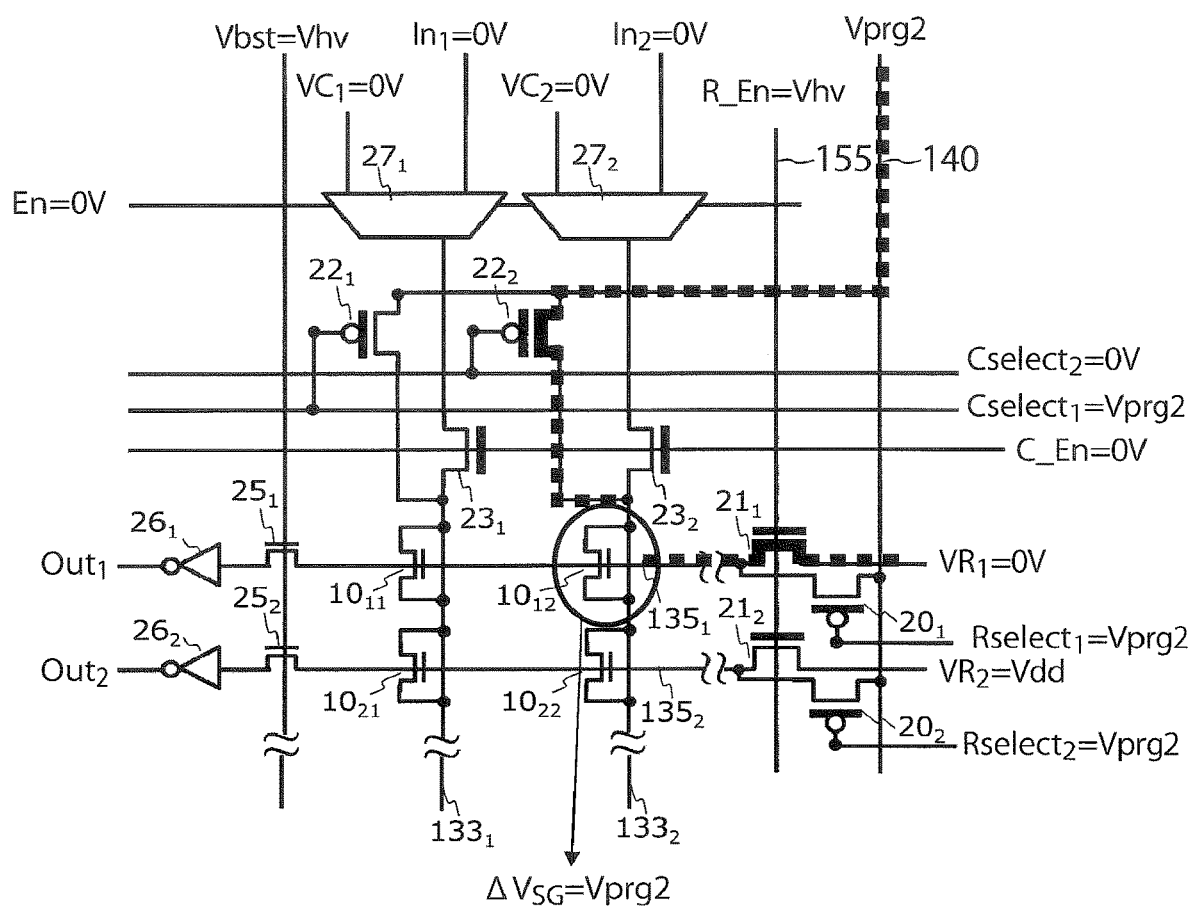
FIG. 7 is a circuit diagram illustrating an example of a write operation performed in a column direction on the memory element of the semiconductor integrated circuit according to the example of the first embodiment.

A write operation performed in one of the memory elements of the semiconductor integrated circuit in the example shown in FIG. 5 will be described below with reference to FIGS. 6 and 7. The write operation includes writing data on one memory element in a row direction, specifically from the gate terminal to the source and drain terminals of a transistor having a two-terminal configuration, and subsequently writing data on the one memory element in a column direction, specifically from the source and drain terminals to the gate terminal of the transistor.

(Writing Data in Row Direction)

First, an example of writing data to one memory element in a row direction will be described with reference to FIG. 6, which shows voltages given to the respective signals supplied to perform the data writing on the memory element $10_{12}$, which is circled.

A voltage Vdd is given to a signal $VC_1$ inputted to one of the input terminals of the selection circuit $27_1$, and a voltage 0 V is given to a signal $In_1$ inputted to the other of the input terminals of the selection circuit $27_1$. The voltage 0 V is also given to a signal $VC_2$ inputted to one of the input terminals of the selection circuit $27_2$, and a signal $In_2$ inputted to the other of the input terminals of the selection circuit $27_2$. When the write operation is performed, the signal $In_1$ and the signal $In_2$ may not be necessarily at 0 V. A signal $Cselect_1$ and a signal $Cselect_2$ supplied to the gate terminals of the p-channel transistors $22_1$ and $22_2$, respectively, are set at a voltage to turn off the p-channel transistors $22_1$ and $22_2$, for example Vprg1. A voltage Vhv is applied to the gate terminals of the n-channel transistors $23_1$ and $23_2$ via the signal C_En to turn on the n-channel transistors $23_1$ and $23_2$. The voltage 0 V is given to the signal R_En to turn off the n-channel transistors $21_1$ and $21_2$. The voltage Vhv is given to the signal Vbst to bring the transistors $25_1$ and $25_2$ into an on state. The voltage 0 V is also given to a signal $Rselect_1$ supplied to the gate terminal of the p-channel transistor $20_1$ to turn on the p-channel transistor $20_1$. At the same time, the voltage Vprg1 is given to a signal $Rselect_2$ supplied to the gate terminal of the p-channel transistor $20_2$ to turn off the p-channel transistor $20_2$. A signal $VR_1$ and a signal $VR_2$ are set at 0 V. An enable signal $En_1$ is set at 0 V, and the selection circuits $27_1$ and $27_2$ select the signals $VC_1$ and $VC_2$, respectively.

In this state, a write voltage Vprg1 is applied to the wiring line 140, the write voltage Vprg1 being conveyed to the wiring line $135_1$ via the p-channel transistor $20_1$. At this time, the voltage of 0 V from the selection circuit $27_2$ is applied to the wiring line $133_2$, to which the source terminal and the drain terminal of the memory element $10_{12}$ are connected, via the n-channel transistor $23_2$. Thus, a voltage $\Delta V_{GS}$=Vprg1 is applied between the gate terminal and the source and drain terminals of the memory element $10_{12}$. The data writing is performed in this manner.

On the other hand, the selection circuit $27_1$ applies the voltage Vdd to the wiring line $133_1$, to which the source terminal and the drain terminal of the memory element $10_{11}$ are connected, via the n-channel transistor $23_1$. As a result, a voltage $\Delta V_{GS}$=Vprg1−Vdd is applied between the gate terminal and the source and drain terminals of the memory element $10_{11}$, and therefore no writing is performed. Since the voltage Vprg1 is applied to the gate terminal of the p-channel transistor $20_2$, no voltage is applied to the gate terminals of the memory elements $10_{21}$ and $10_{22}$, and therefore no writing is performed on these memory elements.

For example, the voltage Vprg1 is 5 to 5.6 V, the voltage Vhv is 3.3 V, and the voltage Vdd is 1.2 V.

The writing of data to the memory element $10_{12}$ in the row direction is performed in the above described manner.

(Writing Data in Column Direction)

Next, an example of writing data to the memory element $10_{12}$ in a column direction will be described with reference to FIG. 7, which shows voltages given to the respective signals supplied to perform the data writing on the memory element $10_{12}$, which is circled.

The voltage 0 V is given to the signal $VC_1$ and the signal $In_1$ inputted to the input terminals of the selection circuit $27_1$, and the signal $VC_2$ and the signal $In_2$ inputted to the input terminals of the selection circuit $27_2$. When the write operation is performed, the signal $In_1$ and the signal $In_2$ may not be necessarily at 0 V. The signal $Cselect_1$ inputted to the gate terminal of the p-channel transistor $22_1$ is set at a voltage to turn off the p-channel transistor $22_1$, for example Vprg2, and the signal $Cselect_2$ inputted to the gate terminal of the p-channel transistor $22_2$ is set at a voltage to turn on the p-channel transistor $22_2$, for example 0 V. The voltage 0 V is given to the signal C_En to turn off the n-channel transistors $23_1$ and $23_2$. The voltage Vhv is given to the signal R_En to turn on the n-channel transistors $21_1$ and $21_2$. The voltage Vhv is given to the signal Vbst to turn on the transistors $25_1$ and $25_2$. The voltage Vprg2 is given to the signal $Rselect_1$ supplied to the gate terminal of the p-channel transistor $20_1$ and the signal $Rselect_2$ supplied to the gate terminal of the p-channel transistor $20_2$ to turn off the p-channel transistor $20_1$ and the p-channel transistor $20_2$. The voltage 0 V is given to the signal $VR_1$, and the voltage Vdd is given to the signal $VR_2$. The voltage 0 V is given to the enable signal En, and the selection circuits $27_1$ and $27_2$ select the signal $VC_1$ and the signal $VC_2$, respectively.

In this state, the write voltage Vprg2 is applied to the wiring line 140, the write voltage Vprg2 being conveyed to the wiring line $133_2$ via the p-channel transistor $22_2$. At this time the voltage 0 V of the signal $VR_1$ is applied to the wiring line $135_1$, to which the gate terminal of the memory element $10_{12}$ is connected, via the n-channel transistor $21_1$. As a result, a voltage $\Delta V_{SC}$=Vprg2 is applied between the source and drain terminals and the gate terminal of the memory element $10_{12}$. The data writing is performed in this manner.

On the other hand, although the voltage Vprg2 is applied to the wiring line $133_2$ to which the source and drain terminals of the memory element $10_{22}$ are connected, the voltage Vdd of the signal $VR_2$ is applied to the wiring line $135_2$, to which the gate terminal of the memory element $10_{22}$ is connected, via the n-channel transistor $21_2$. Therefore, a voltage $\Delta V_{SG}$=Vprg2-Vdd is applied between the source and drain terminals and the gate terminal of the memory element $10_{22}$, and therefore no data is written to the memory element $10_{22}$. Furthermore, since the voltage Vprg2 is applied to the gate terminal of the p-channel transistor $22_1$, no voltage is applied to the gate terminals of the memory elements $10_{11}$ and $10_{21}$. Therefore, no data is written to the memory elements $10_{11}$ and $10_{21}$. The voltage Vprg2 is a voltage that allows data to be written to the memory element, for example, and may have the same value as the voltage Vprg1. The writing of data to the memory element $10_{12}$ in the column direction is performed in the above-described manner.

As described above, after the data writing is performed in the row direction, the data writing in the column direction is additionally performed on one memory element in the first embodiment and the example of the first embodiment. As a result, regardless of the direction of the read current flowing through the memory element to which the data writing is performed, the resistance value measured is substantially the same. Thus, the rectifying characteristic is curbed.

Unlike the first embodiment and the example of the first embodiment, the data writing in the column direction may be performed first, and the data writing in the row direction may be additionally performed on the one memory element.

Although the memory elements are arranged in a 2×2 array form in the semiconductor integrated circuits according to the first embodiment and the example of the first embodiment, they may be arranged in an m (m≥1)×n (n≥1) array form. It should be noted that the write operation is performed on at most one of a plurality of memory elements connected to one wiring line $135_i$ (i=1, 2), but not two or more memory elements.

(Normal Operation)

Figure 8:
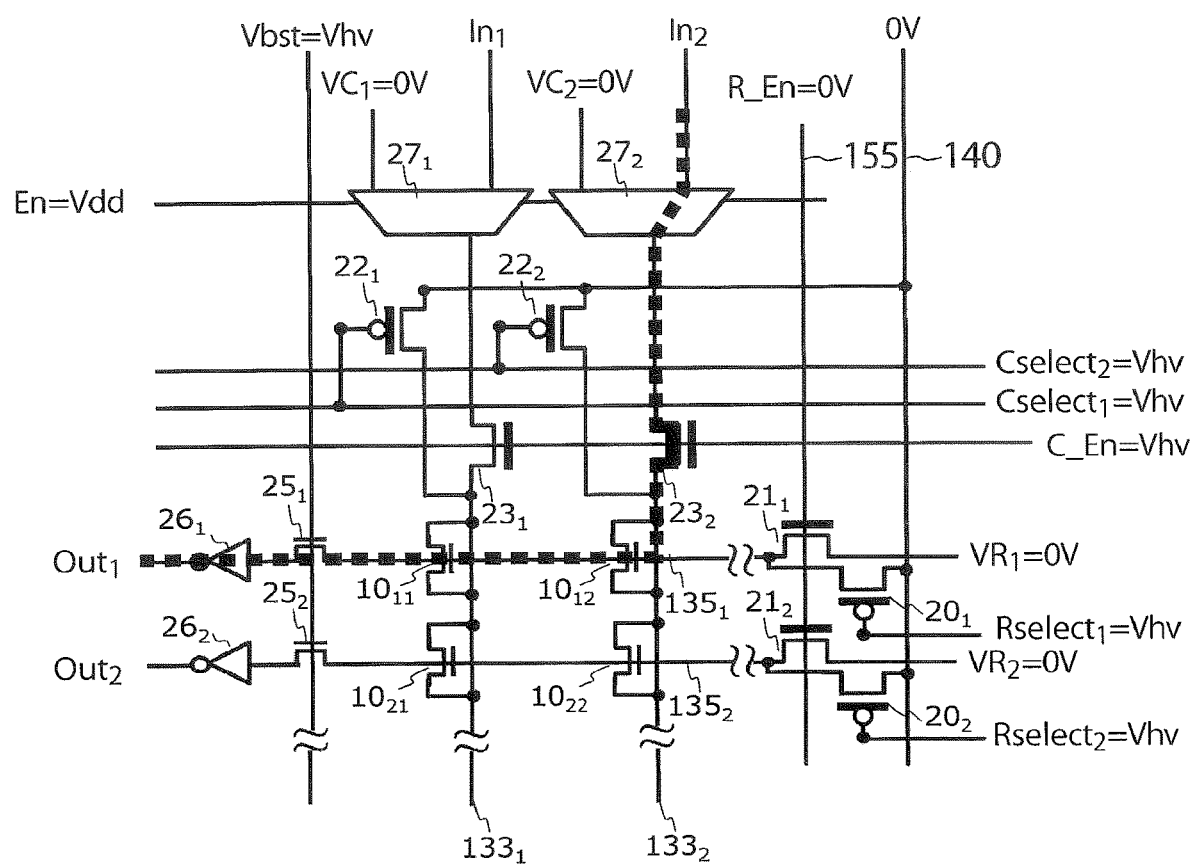
FIG. 8 is a circuit diagram illustrating an example of a normal operation performed in the semiconductor integrated circuit according to the example of the first embodiment.

A normal operation of the semiconductor integrated circuit according to the example of the first embodiment will be described next with reference to FIG. 8. FIG. 8 shows voltages given to the respective signals in the normal operation, in which data is written to the memory element $10_{12}$ and no data is written to the other memory elements.

The voltage 0 V is given to the signal $VC_1$ supplied to the one input terminal of the selection circuit $27_1$, and the signal $VC_2$ supplied to the one input terminal of the selection circuit $27_2$. In the normal operation, the voltage given to the signals $VC_1$ and $VC_2$ may not be necessarily 0 V. A voltage to turn off the p-channel transistor $22_1$, for example the voltage Vhv, is given to the signal $Cselect_1$ supplied to the gate terminal of the p-channel transistor $22_1$, and a voltage to turn off the p-channel transistor $22_2$, for example the voltage Vhv, is given to the signal $Cselect_2$ supplied to the gate terminal of the p-channel transistor $22_2$. The voltage Vhv is also given to the signal C_En to turn on the n-channel transistors $23_1$ and $23_2$. The voltage 0 V is given to the signal R_En to turn off the n-channel transistors $21_1$ and $21_2$. The voltage Vhv is given to the signal Vbst to turn on the transistors $25_1$ and $25_2$. Furthermore, the voltage Vhv is given to the signal $Rselect_1$ supplied to the gate terminal of the p-channel transistor $20_1$, and the signal $Rselect_2$ supplied to the gate terminal of the p-channel transistor $20_2$ to turn off the p-channel transistor $20_1$ and the p-channel transistor $20_2$. The voltage 0 V is given to the signal $VR_1$ and the signal $VR_2$. The voltage 0 V is also given to the wiring line 140. In the normal operation, the voltage given to the wiring line 140 may not be necessarily 0 V.

The voltage Vdd is given to the enable signal En so that the selection circuits $27_1$ and $27_2$ select the signals $In_1$ and $In_2$, respectively. The signal $In_2$ supplied to the selection circuit $27_2$ passes through the n-channel transistor $23_2$, the memory element $10_{12}$, the wiring line $135_1$, the n-channel transistor $25_1$, and the inverter $26_1$, and is outputted as an output signal $Out_1$. Since no data is written to the memory element $10_{21}$, the signal $In_1$ supplied to the selection circuit $27_1$ is not outputted to the outside. The normal operation is performed in this manner.

FIG. 9 shows the values of the respective signals used in the data writing in the row direction, the data writing in the column direction, and the normal operation. In FIG. 9, the expression "A/B" means that a voltage A is given to the signal supplied to a selected row or a selected column, and a voltage B is given to the signals supplied to the non-selected rows or the non-selected columns. For example, in the data writing in the row direction, the signal $Rselect_i$ (i=1, 2) is indicated as 0 V/Vprg1, which means that 0 V is given to the selected row, and the voltage Vprg1 is given to the non-selected rows.

Figure 10:
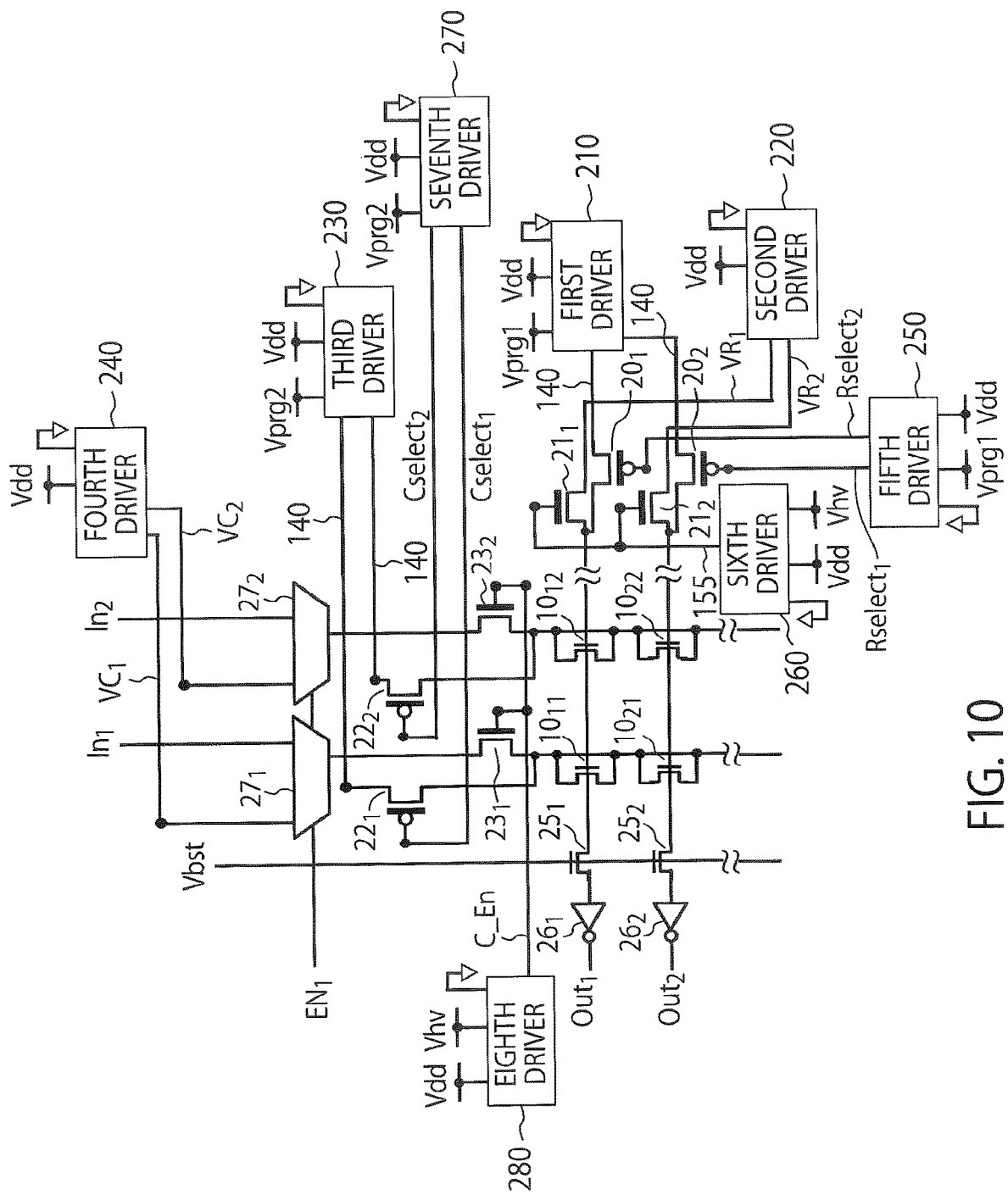
FIG. 10 is a diagram illustrating a semiconductor integrated circuit according to the example of the first embodiment, to which drivers are added.

The semiconductor integrated circuits according to the first embodiment and the example of the first embodiment further include first to eighth drivers for generating voltages (potentials) given to the respective signals used in the data writing in the row direction, the data writing in the column direction, and the normal operation. FIG. 10 shows a semiconductor integrated circuit according to the example of the first embodiment, to which the first to eighth drivers are provided.

A first driver 210 supplies the voltage Vprg1, the voltage Vdd, or 0 V to the wiring line 140. A second driver 220 supplies the voltage Vdd or 0 V to the wiring lines applied the signals $VR_1$ and $VR_2$.

A third driver 230 supplies the voltage Vprg2, the voltage Vdd, or 0 V to the wiring line 140. A fourth driver 240 supplies the voltage Vdd or 0 V to as the signals $VC_1$ and $VC_2$. A fifth driver 250 supplies the voltage Vprg1, the voltage Vdd, or 0 V as the signal $Rselect_1$ and the signal $Rselect_2$. A sixth driver 260 supplies the voltage Vdd, the voltage Vhv, or 0 V to the wiring line 155. A seventh driver 270 supplies the voltage Vprg2, the voltage Vdd, or 0 V to the wiring lines applied the signals $Cselect_1$ and $Cselect_2$. An eighth driver 280 supplies the voltage Vdd, the voltage Vhv, or 0 V to the wiring line applied the signal C_En.

Figure 11:
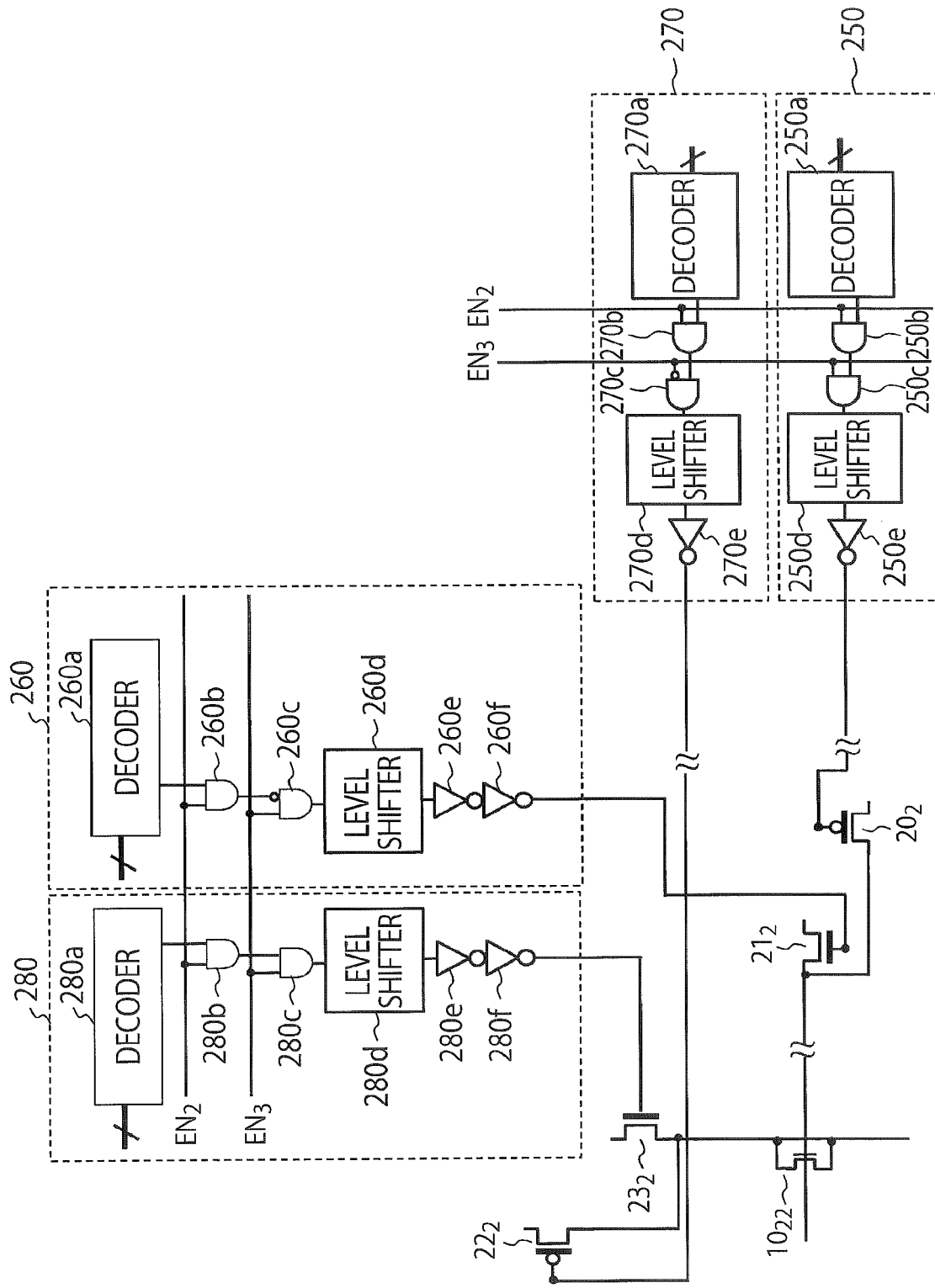
FIG. 11 is a circuit diagram of a specific example of the drivers shown in FIG. 10.

A specific example of some of the drivers, for example the fifth to eighth drivers 250 to 280, is shown in FIG. 11. The fifth driver 250 includes a decoder 250a, AND gates 250b and 250c, a level shifter 250d, and an inverter 250e. The sixth driver 260 includes a decoder 260a, AND gates 260b and 260c, a level shifter 260d, and inverters 260e and 260f. The seventh driver 270 includes a decoder 270a, AND gates 270b and 270c, a level shifter 270d, and an inverter 270e. The eighth driver 280 includes a decoder 280a, AND gates 280b and 280c, a level shifter 280d, and inverters 280e and 280f.

Each decoder receives a selection address signal and outputs a decoded signal to the corresponding AND gate. For example, in the fifth driver 250, the decoder 250a decodes the selection address signal, and outputs a decoded signal to the AND gate 250b. The AND gate 250b performs an AND operation on the decoded signal and an enable signal $En_2$, and sends an operation result to the AND gate 250c. The AND gate 250c performs an AND operation on the operation result from the AND gate 250b and an enable signal $En_3$, and sends an operation result to the level shifter 250d. The level shifter 250d shifts the signal level of the operation result from the AND gate 250c, and sends a shifted signal to the inverter 250e. The inverter 250e inverts the signal from the level shifter 250d, and sends an inverted signal to the gate of the p-channel transistor $20_2$.

In the sixth driver 260, the decoder 260a decodes the selection address signal, and sends a decoded signal to the AND gate 260b. The AND gate 260b performs an AND operation on the decided signal and the enable signal $En_2$, and sends an operation result to the AND gate 260c. The AND gate 260c performs an AND operation on an inverted signal of the operation result from the AND gate 260b and the enable signal $En_3$, and sends an operation result to the level shifter 260d. The level shifter 260d shifts the signal level of the operation result of the AND gate 260c, and sends a shifted signal to the inverter 260e. The inverter 260e inverts the signal from the level shifter 260d, and sends an inverted signal to the inverter 260f. The inverter 260f inverts the signal from the inverter 260e, and sends an inverted signal to the gate of the n-channel transistor $21_2$.

In the seventh driver 270, the decoder 270a decodes the selection address signal, and sends a decoded signal to the AND gate 270b. The AND gate 270b performs an AND operation on the decoded signal and the enable signal $En_2$, and sends an operation result to the AND gate 270c. The AND gate 270c performs an AND operation on the operation result from the AND gate 270b and an inverted signal of the enable signal $En_3$, and sends an operation result to the level shifter 270d. The level shifter 270d shifts the signal level of the operation result of the AND gate 270c, and sends a shifted signal to the inverter 270e. The inverter 270e inverts the signal from the level shifter 270d, and sends an inverted signal to the gate of the p-channel transistor $22_2$.

In the eighth driver 280, the decoder 280a decodes the selection address signal, and sends a decoded signal to the AND gate 280b. The AND gate 280b performs an AND operation on the decoded signal and the enable signal $En_2$, and sends an operation result to the AND gate 280c. The AND gate 280c performs an AND operation on an inverted signal of the operation result of the AND gate 280b and the enable signal $En_3$, and sends an operation result to the level shifter 280d. The level shifter 280d shifts the signal level of the operation result from the AND gate 280c, and sends a shifted signal to the inverter 280e. The inverter 280e inverts the signal from the level shifter 280d and sends an inverted signal to the inverter 280f. The inverter 280f inverts the signal from the inverter 280e and sends an inverted signal to the gate of the n-channel transistor $23_2$.

Figures 12, 13:
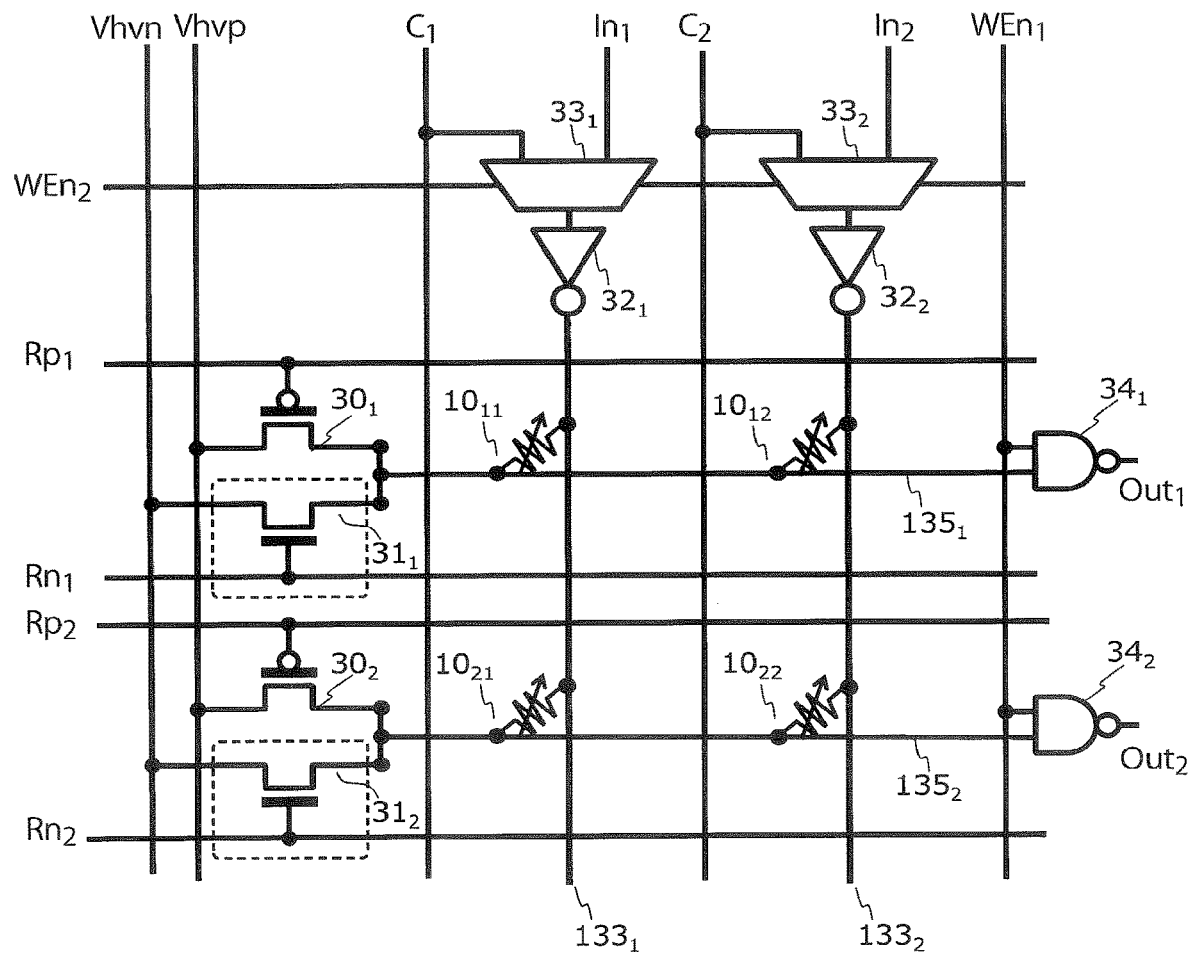
FIG. 12 is a diagram showing an example of enable signals shown in FIG. 11.
FIG. 13 is a circuit diagram illustrating a semiconductor integrated circuit according to a second embodiment.

In the data writing in the row direction, the data writing in the column direction, and the normal operation, the values of the enable signals $En_2$ and $En_3$ are as shown in FIG. 12. For example, the enable signal $En_2$ is at Vdd during the data writing in the row direction, the data writing in the column direction, and the normal operation, and the enable signal $En_3$ is at Vdd in the data writing in the row direction, and at 0 V in the data writing in the column direction and the normal operation.

Although FIG. 10 illustrates the first to eighth drivers, a single driver (control circuit) may be used instead of the eight drivers to control the respective transistors and selection circuits.

As described above, the semiconductor integrated circuits according to the first embodiment and the example of the first embodiment are capable of preventing a delay in operation speed even if OTP memory elements are used.

Second Embodiment

FIG. 13 shows a semiconductor integrated circuit according to a second embodiment. The semiconductor integrated circuit according to the second embodiment is used in an FPGA, for example, and includes wiring lines $133_1$ and $133_2$, wiring lines $135_1$ and $135_2$, and OTP memory elements ("memory elements") $10_{11}$, $10_{12}$, $10_{21}$, and $10_{22}$ arranged in an array form. The wiring lines $135_1$ and $135_2$ intersect with the wiring lines $133_1$ and $133_2$. Each memory element $10_{ij}$ is provided to an intersection region of the wiring line $133_{ij}$ (i, j=1, 2) and the wiring line $135_{ij}$. Each memory element $10_{ij}$ (i, j=1, 2) has a two-terminal configuration with a first terminal and a second terminal, the first terminal being connected to the corresponding wiring line $133_j$, and the second terminal being connected to the corresponding wiring line $135_i$.

The semiconductor integrated circuit according to the second embodiment further includes p-channel MOS transistors ("p-channel transistors") $30_1$ and $30_2$, n-channel MOS transistors ("n-channel transistors") $31_1$ and $31_2$, inverters $32_1$ and $32_2$, selection circuits (multiplexers) $33_1$ and $33_2$, and NAND gates $34_1$ and $34_2$. The p-channel transistors $30_1$ and $30_2$ and the n-channel transistors $31_1$ and $31_2$ are high breakdown voltage transistors, which have a thicker gate insulating film than ordinary transistors. The n-channel transistors $31_1$ and $31_2$ are each formed on an independent well (deep-n-well) that is isolated from a p-type wafer substrate, on which the p-channel transistors are formed, so as not to be connected to the wafer substrate. In FIG. 13, the broken lines surrounding the n-channel transistors $31_1$ and $31_2$ indicate the independent wells.

The gate terminal of the p-channel transistor $30_i$ (i=1, 2) is connected to a wiring line applied a signal $Rp_i$, one of the source and drain terminals is connected to the wiring line $135_i$, and the other is connected to a wiring line applied a signal Vhvp. The gate terminal of the n-channel transistor $31_i$ (i=1, 2) is connected to a wiring line $Rn_i$, one of the source and drain terminals is connected to the wiring line $135_i$, and the other is connected to a wiring line applied a signal Vhvn.

The selection circuit $33_j$ (j=1, 2) selects one of a signal $C_j$ and an input signal $In_j$ according to a control signal $WEn_2$, and sends the selected signal to the inverter $32_j$. Thus, the selection circuit $33_j$ (j=1, 2) electrically connects one of the input terminals to the output terminal according to the control signal $WEn_2$. The input terminal of the inverter $32_j$ (j=1, 2) is connected to the output terminal of the selection circuit $33_j$, and the output terminal is connected to the wiring line $133_j$.

One of two input terminals of the NAND gate $34_i$ (i=1, 2) is connected to the wiring line $135_i$, and the other is connected to a wiring line applied a signal $WEn_1$. The NAND gate $34_i$ (i=1, 2) outputs an output signal Out; from an output terminal.

Figure 14:
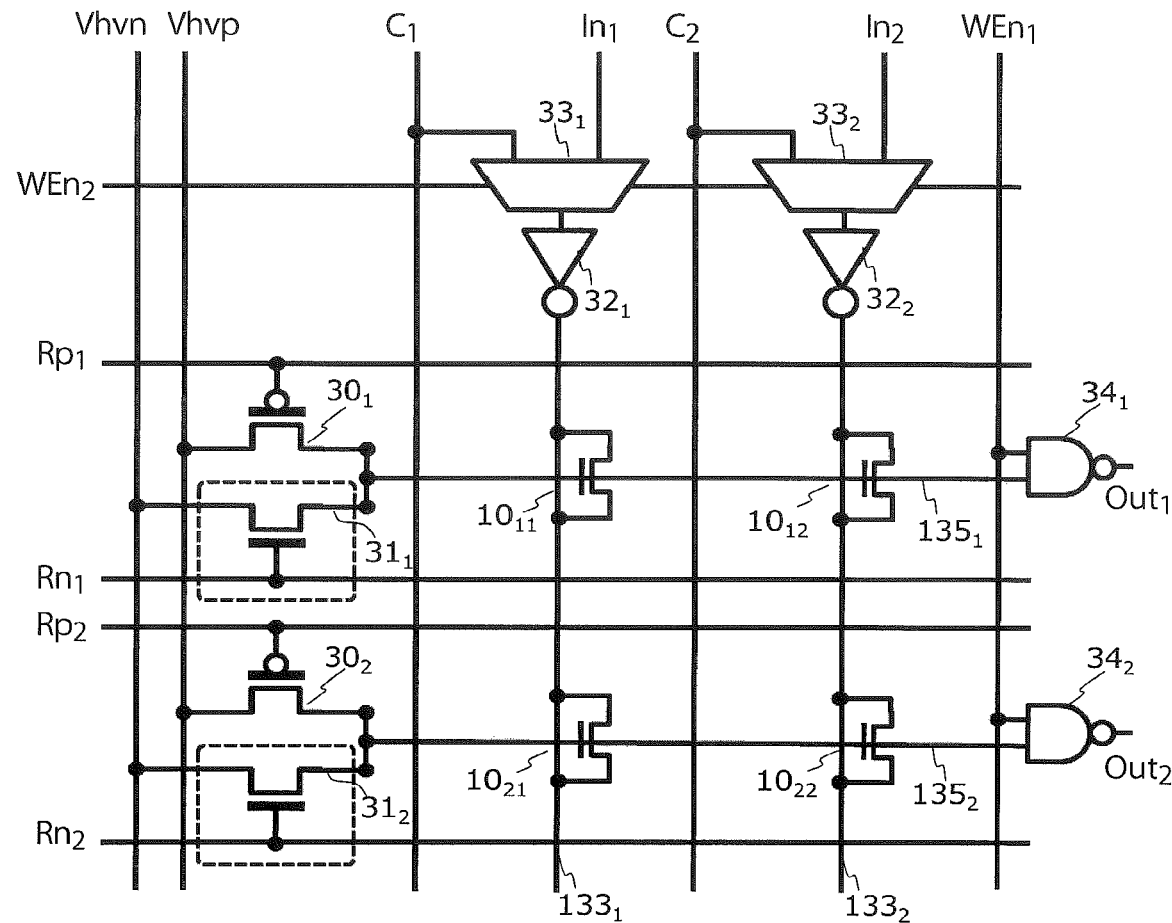
FIG. 14 is a circuit diagram illustrating a semiconductor integrated circuit according to an example of the second embodiment.

FIG. 14 shows an example of the semiconductor integrated circuit according to the second embodiment shown in FIG. 13, in which the transistor having a two-terminal configuration 10 shown in FIG. 1 is used as each memory element $10_{ij}$ (i, j=1, 2). In FIG. 14, the gate terminal of the memory element $10_{ij}$ (i, j=1, 2) is connected to the wiring line $135_i$, and the source and drain terminals are connected to the wiring line $133_j$. Although no drawing is provided, the gate terminal of the memory element $10_{ij}$ (i, j=1, 2) may be connected to the wiring line $133_j$, and the source and drain terminals may be connected to the wiring line $135_j$.

(Write Operation)

Figure 15:
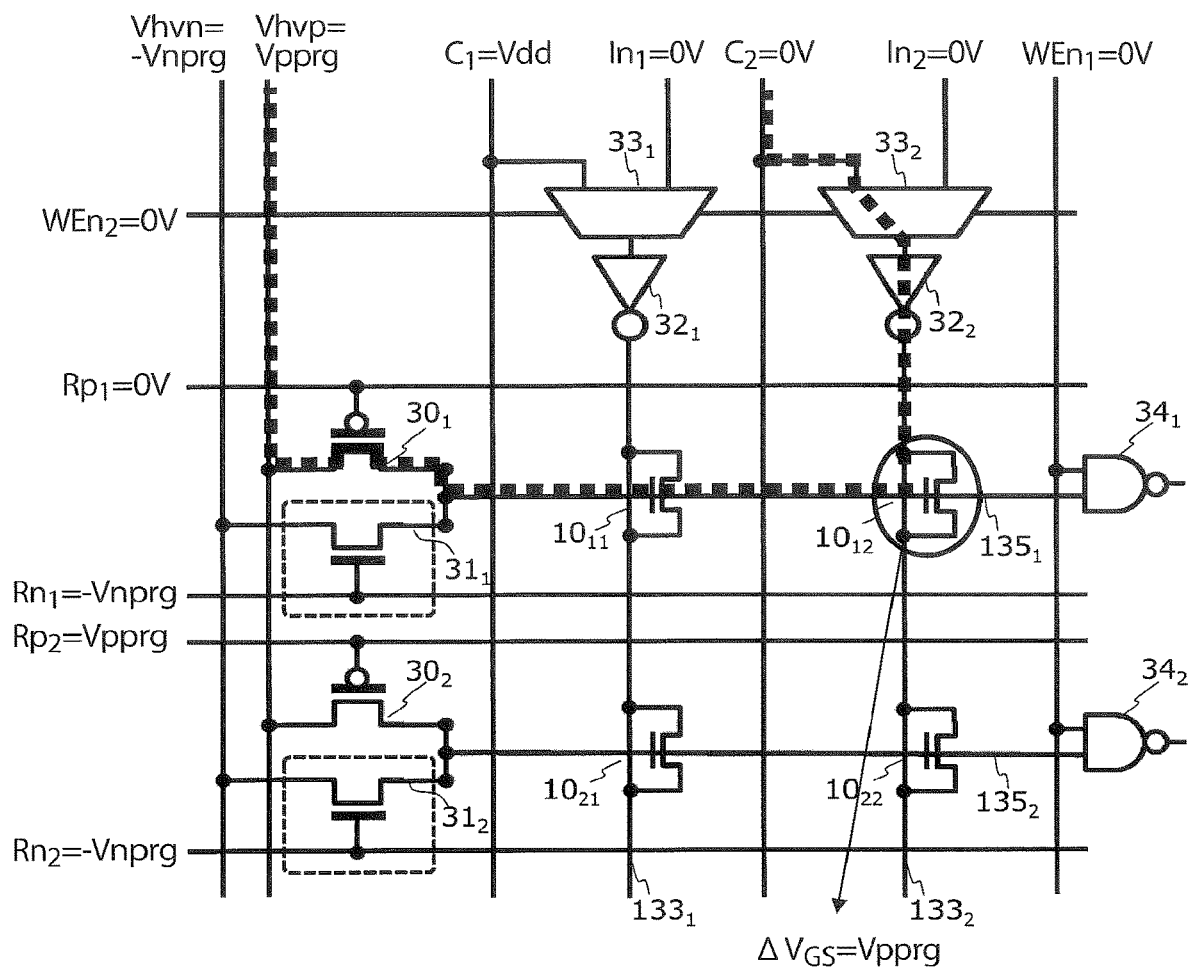
FIG. 15 is a circuit diagram illustrating an example of a write operation performed in a row direction in the semiconductor integrated circuit according to the example of the second embodiment.
Figure 16:
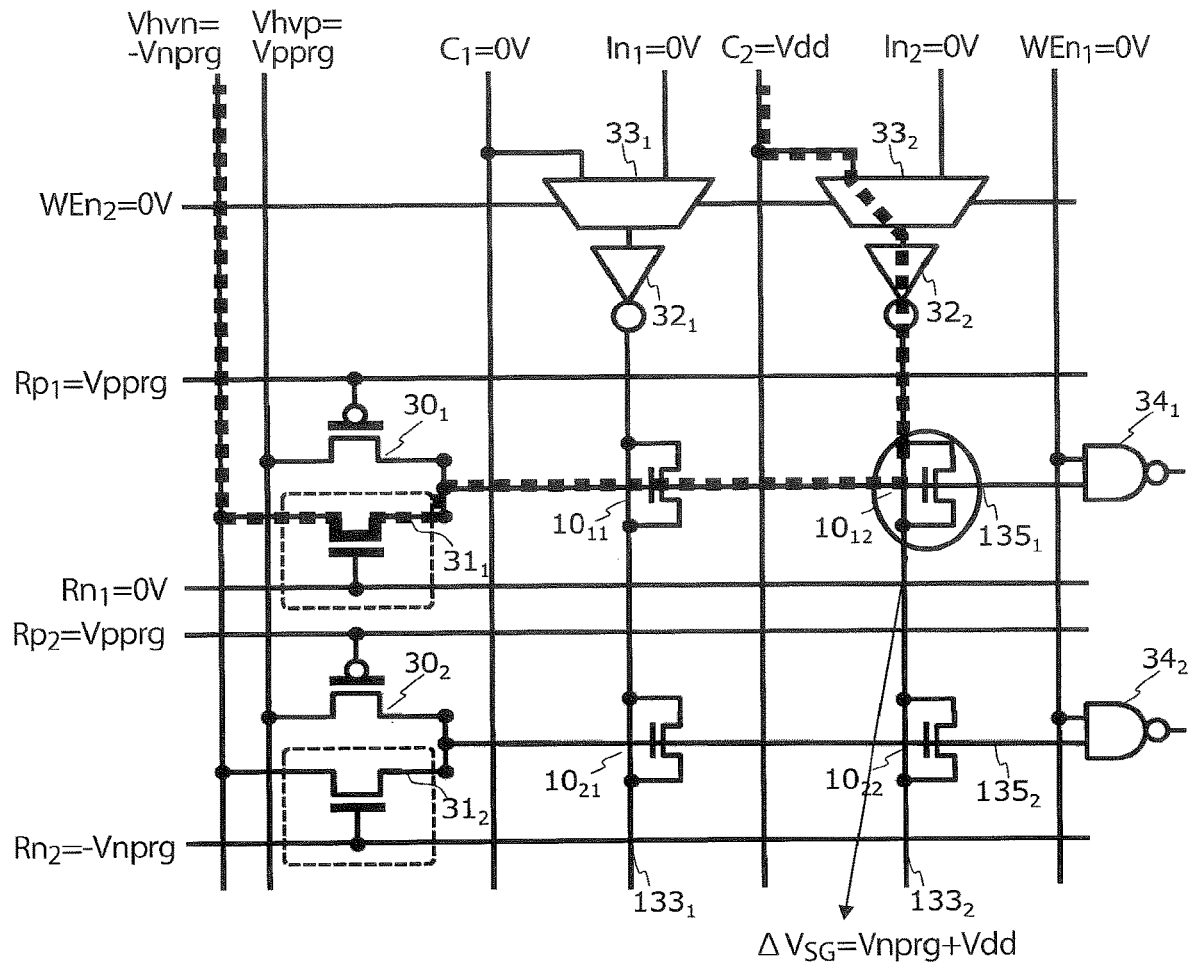
FIG. 16 is a circuit diagram illustrating an example of a write operation performed in a column direction in the semiconductor integrated circuit according to the example of the second embodiment.

A write operation performed on one of the memory elements included in the semiconductor integrated circuit according to the example shown in FIG. 14 will be described with reference to FIGS. 15 and 16. The write operation includes writing data on one memory element in a row direction, specifically from the gate terminal to the source and drain terminals of a transistor having a two-terminal configuration and subsequently writing data on the one memory element from a column direction, specifically from the source and drain terminals to the gate terminal of the transistor.

(Writing Data in Row Direction)

First, an example of writing data to one memory element in a row direction will be described with reference to FIG. 15, which shows voltages given to the respective signals supplied to perform the data writing on the memory element $10_{12}$, which is circled.

A voltage Vdd is given to a signal $C_1$ inputted to one of the input terminals of the selection circuit $33_1$, and a voltage 0 V is given to a signal $In_1$ inputted to the other of the input terminals of the selection circuit $33_1$. The voltage 0V is also given to a signal $C_2$ inputted to one of input terminals of the selection circuit $33_2$, and a signal $In_2$ inputted to the other. When the write operation is performed, the signal $In_1$ and the signal $In_2$ may not be necessarily at 0 V. A signal $Rp_1$ supplied to the gate terminal of the p-channel transistor $30_1$ is set at a voltage to turn on the p-channel transistor $30_1$, for example 0 V, and a signal $Rp_2$ supplied to the gate terminal of the p-channel transistor $30_2$ is set at a voltage to turn off the p-channel transistor $30_2$, for example Vpprg. A signal $Rn_1$ and a signal $Rn_2$ supplied to the gate terminals of the n-channel transistors $31_1$ and $31_2$, respectively, are set at a voltage to turn off the n-channel transistors $31_1$ and $31_2$, for example −Vnprg. A voltage −Vnprg is given to the signal Vhvn, and the voltage 0 V is given to the signal $WEn_1$. The voltage 0 V is given to a signal $WEn_2$ so that the selection circuits $33_1$ and $33_2$ select signals $C_1$ and $C_2$, respectively.

In this state, a write voltage Vpprg is given to the wiring line Vhvp, the write voltage Vpprg being conveyed to the wiring line $135_1$ via the p-channel transistor $30_1$. Since the p-channel transistor $30_2$ is in the off state, the write voltage Vpprg is not applied to the wiring line $135_2$. The voltage 0 V is applied to the wiring line $133_2$ via the selection circuit $33_2$ and the inverter $32_2$. As a result, a voltage $\Delta V_{CS}$=Vpprg is applied between the gate terminal and the source and drain terminals of the memory element $10_{12}$, and data is written to the memory element $10_{12}$. At this time, a signal obtained by inverting signal $C_1$ at the voltage Vdd is applied to the source and drain terminals of the memory element $10_{11}$ via the wiring line $133_1$. Therefore, a voltage Vpprg−Vdd is applied between the gate terminal and the source and drain terminals of the memory element $10_{11}$. As a result, no data is written to the memory element $10_{11}$. No voltage is applied between the gate terminal and the source and drain terminal of each of the memory element $10_{21}$ and the memory element $10_{22}$. Therefore, no data is written to the memory element $10_{21}$ and the memory element $10_{22}$. The voltage Vbd is a breakdown voltage of the gate insulating films of the memory elements $10_{11}$ to $10_{22}$, and the voltages Vpprg and Vnprg meet the following conditions:

$Vpprg>Vbd>Vnprg,$ $Vnprg+Vdd>Vbd$

For example, Vpprg is at 5 to 5.6 V, Vbd is at 4.7 V, Vnprg is at 3.8 to 4.4 V, and Vdd is at 1.2 V. The above numerical values may change depending on the process generation.

The writing of data to the memory element $10_{12}$ in the row direction is performed in this manner by applying a voltage from the gate terminal.

(Writing Data in Column Direction)

Next, an example of writing data to the memory element $10_{12}$ in the column direction will be described with reference to FIG. 16, which shows voltages given to the respective signals supplied to perform the data writing on the memory element $10_{12}$, which is circled.

The voltage 0 V is given to the signal $C_1$ and the signal $In_1$ inputted to the input terminals of the selection circuit $33_1$. The voltage Vdd is given to the signal $C_2$ inputted to one of the input terminals of the selection circuit $33_2$, and the voltage 0 V is given to the signal $In_2$ inputted to the other. When the write operation is performed, the signal $In_1$ and the signal $In_2$ may not be necessarily 0 V. The signal $Rp_1$ supplied to the gate terminal of the p-channel transistor $30_1$ is set at a voltage to turn off the p-channel transistor $30_1$, for example Vpprg, and the signal $Rp_2$ supplied to the gate terminal of the p-channel transistor $30_2$ is set at a voltage to turn off the p-channel transistor $30_2$, for example Vpprg. The signal $Rn_1$ supplied to the gate terminal of the n-channel transistor $31_1$ is set at a voltage to turn on the n-channel transistor $31_1$, for example 0 V, and the signal $Rn_2$ supplied to the gate terminal of the n-channel transistor $31_2$ is set at a voltage to turn off the n-channel transistor $31_2$, for example −Vnprg. The voltage Vpprg is given to the signal Vhvp, and the voltage 0 V is given to the signal $WEn_1$. The voltage 0 V is given to the signal $WEn_2$ so that the selection circuits $33_1$ and $33_2$ select the signals $C_1$ and $C_2$, respectively.

In this state, a write voltage −Vnprg is given to the signal Vhvn, the write voltage −Vnprg being conveyed to the wiring line $135_1$ via the n-channel transistor $31_1$. Since the n-channel transistor $31_2$ is in the off state, the write voltage −Vnprg is not applied to the wiring line $135_2$. The voltage Vdd is applied to the wiring line $133_2$ via the selection circuit $33_2$ and the inverter $32_2$. As a result, a voltage $\Delta V_{SC}$=Vnprg+Vdd is applied between the source and drain terminals and the gate terminal of the memory element $10_{12}$, so that data is written to the memory element $10_{12}$. At this time, a signal obtained by inverting the signal $C_1$ at the voltage 0 V is applied to the source and drain terminals of the memory element $10_{11}$ via the wiring line $133_1$. Therefore, the voltage Vnprg is applied between the gate terminal and the source and drain terminals of the memory element $10_{11}$. As a result, no data is written to the memory element $10_{11}$. No voltage is applied between the gate terminal and the source and drain terminals of the memory element $10_{21}$ and the memory element $10_{22}$. Therefore, no data is written to the memory element $10_{21}$ and the memory element $10_{22}$.

The writing of data to the memory element $10_{12}$ in the column direction is performed in this manner by applying a voltage from the source and drain terminals.

As described above, after the data writing is performed in the row direction, the data writing in the column direction is additionally performed on one memory element in the second embodiment and the example of the second embodiment. As a result, regardless of the direction of the read current flowing through the memory element to which the data writing is performed, the resistance value measured is substantially the same. Thus, the rectifying characteristic is curbed.

Unlike the second embodiment and the example of the second embodiment, the data writing in the column direction may be performed first, and the data writing in the row direction may be additionally performed on the one memory element.

Although the memory elements are arranged in a 2×2 array form in the semiconductor integrated circuits according to the second embodiment and the example of the second embodiment, they may be arranged in an m (m≥1)×n (n≥1) array form. It should be noted that the write operation is performed on at most one of a plurality of memory elements connected to one wiring line $135_i$ (i=1, 2), but not two or more memory elements.

(Normal Operation)

Figure 17:
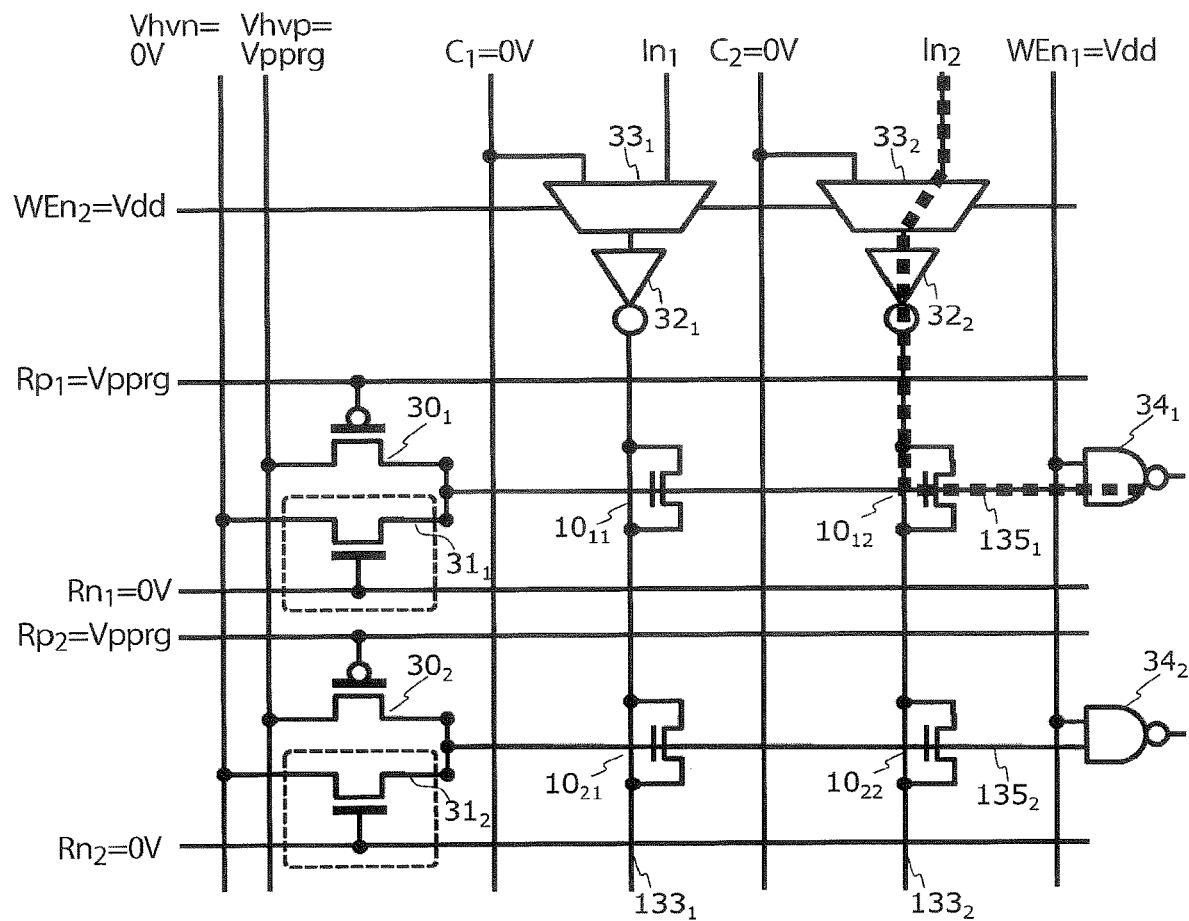
FIG. 17 is a circuit diagram illustrating an example of a normal operation performed in the semiconductor integrated circuit according to the example of the second embodiment.

A normal operation of the semiconductor integrated circuit according to the example of the second embodiment will be described next with reference to FIG. 17. FIG. 17 shows voltages given to the respective signals in the normal operation, in which data is written to the memory element $10_{12}$ and no data is written to the other memory elements.

The voltage 0 V is given to the signal $C_1$ inputted to the one input terminal of the selection circuit $33_1$, and the signal $C_2$ inputted to the one input terminal of the selection circuit $33_2$. In the normal operation, the voltage given to the signals $C_1$ and $C_2$ may not be necessarily 0 V.

A voltage to turn off the p-channel transistor $30_1$, for example Vpprg, is given to the signal $Rp_1$ supplied to the gate terminal of the p-channel transistor $30_1$, and a voltage to turn off the p-channel transistor $30_2$, for example Vpprg, is given to the signal $Rp_2$ supplied to the gate terminal of the p-channel transistor $30_2$. The voltage 0 V is given to the signal $Rn_1$ supplied to the gate of the n-channel transistor $31_1$, and the signal $Rn_2$ inputted to the gate of the n-channel transistor $31_2$. The voltage Vpprg is given to the signal Vhvp, the voltage 0 V is given to the signal Vhvn, and the voltage Vdd is given to the signal WEn1.

The voltage Vdd is given to the enable signal WEn2 so that the selection circuits $33_1$ and $33_2$ select the signals $In_1$ and $In_2$, respectively. The signal $In_2$ inputted to the selection circuit $33_2$ passes through the selection circuit $33_2$, the inverter $32_2$, the memory element $10_{12}$, the wiring line $135_1$, and the NAND gate $34_1$, and is outputted as an output signal $Out_1$ to the outside. Since no data is written to the memory element $10_{21}$, the signal $In_1$ inputted to the selection circuit $33_1$ is not outputted to the outside. The normal operation is performed in this manner.

FIG. 18 shows the values of the respective signals used in the data writing in the row direction, the data writing in the column direction, and the normal operation. In FIG. 18, the expression "A/B" means that a voltage A is given to the signal supplied to a selected row or a selected column, and a voltage B is given to the signals supplied to the non-selected rows or the non-selected columns. For example, in the data writing in the row direction, the signal $Rp_i$ (i=1, 2) is indicated as 0 V/Vpprg, which means that 0 V is given to the selected row, and the voltage Vpprg is given to the non-selected rows.

A switching element, for example a transistor (now shown), may be disposed between the wiring line $135_i$ (i=1, 2) and the NAND gate $34_i$ in the semiconductor integrated circuits according to the second embodiment shown in FIG. 13 and the example of the second embodiment shown in FIG. 14. The switching element is turned off during the data writing in the row direction and the data writing in the column direction, and turned on during the normal operation.

Figure 19:
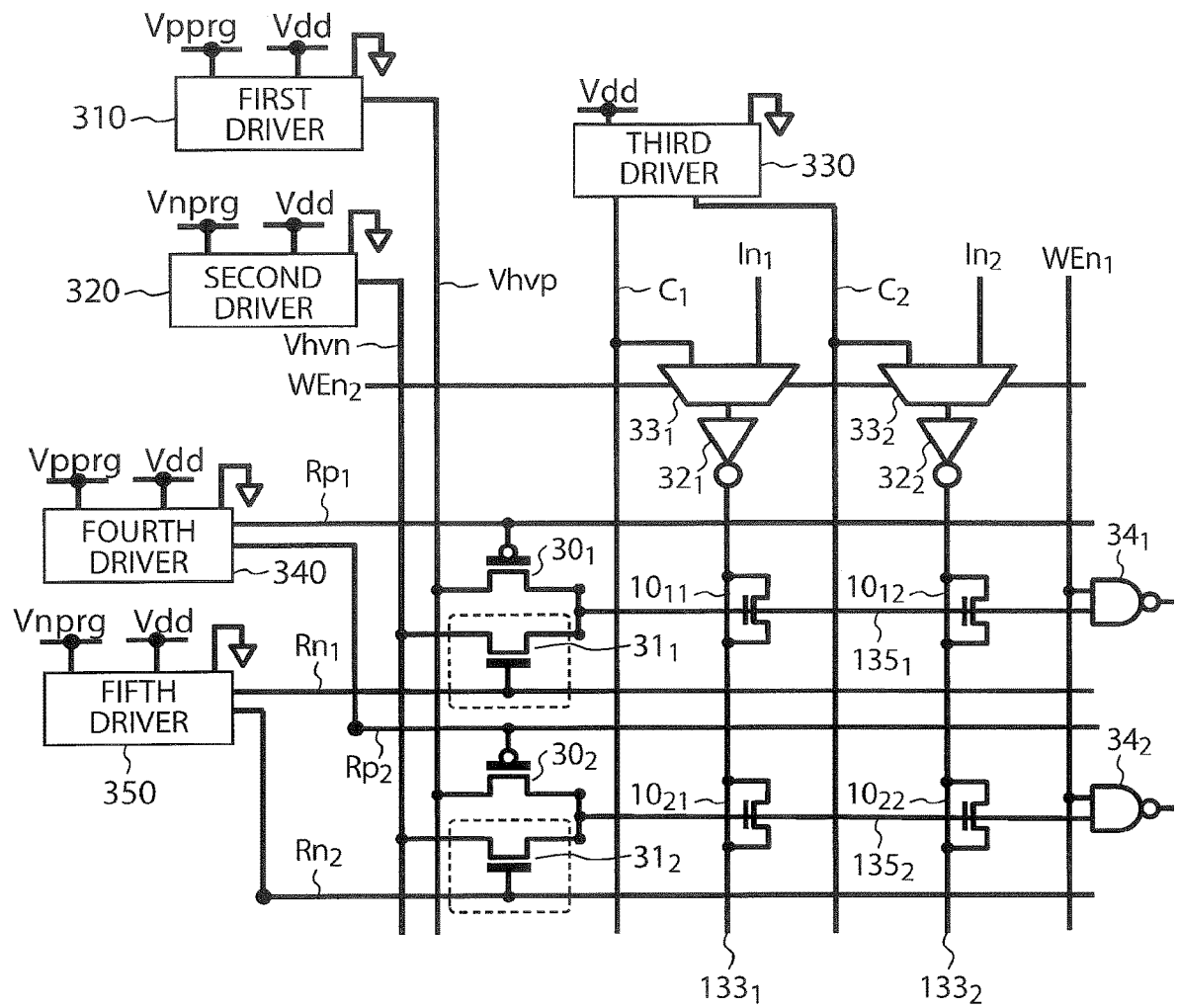
FIG. 19 is a diagram illustrating a semiconductor integrated circuit according to the example of the second embodiment, to which drivers are added.

The semiconductor integrated circuits according to the second embodiment and the example of the second embodiment further include first to fifth drivers for generating voltages (potentials) given to the respective signals used in the data writing in the row direction, the data writing in the column direction, and the normal operation. FIG. 19 shows a semiconductor integrated circuit according to the example of the second embodiment, to which the first to fifth drivers are provided.

A first driver 310 supplies the voltage Vpprg, the voltage Vdd, or 0 V as the signal Vhvp. A second driver 320 supplies the voltage Vnprg, the voltage Vdd, or 0 V as the signal Vhvn. A third driver 330 supplies the voltage Vdd or 0 V as the signal $C_1$ and the signal $C_2$. A fourth driver 340 supplies the voltage Vpprg, the voltage Vdd, or 0 V as the signal $Rp_1$ and the signal $Rp_2$. A fifth driver 350 supplies the voltage Vnprg, the voltage Vdd, or 0 V as the signal $Rn_1$ and the signal $Rn_2$.

Figure 20:
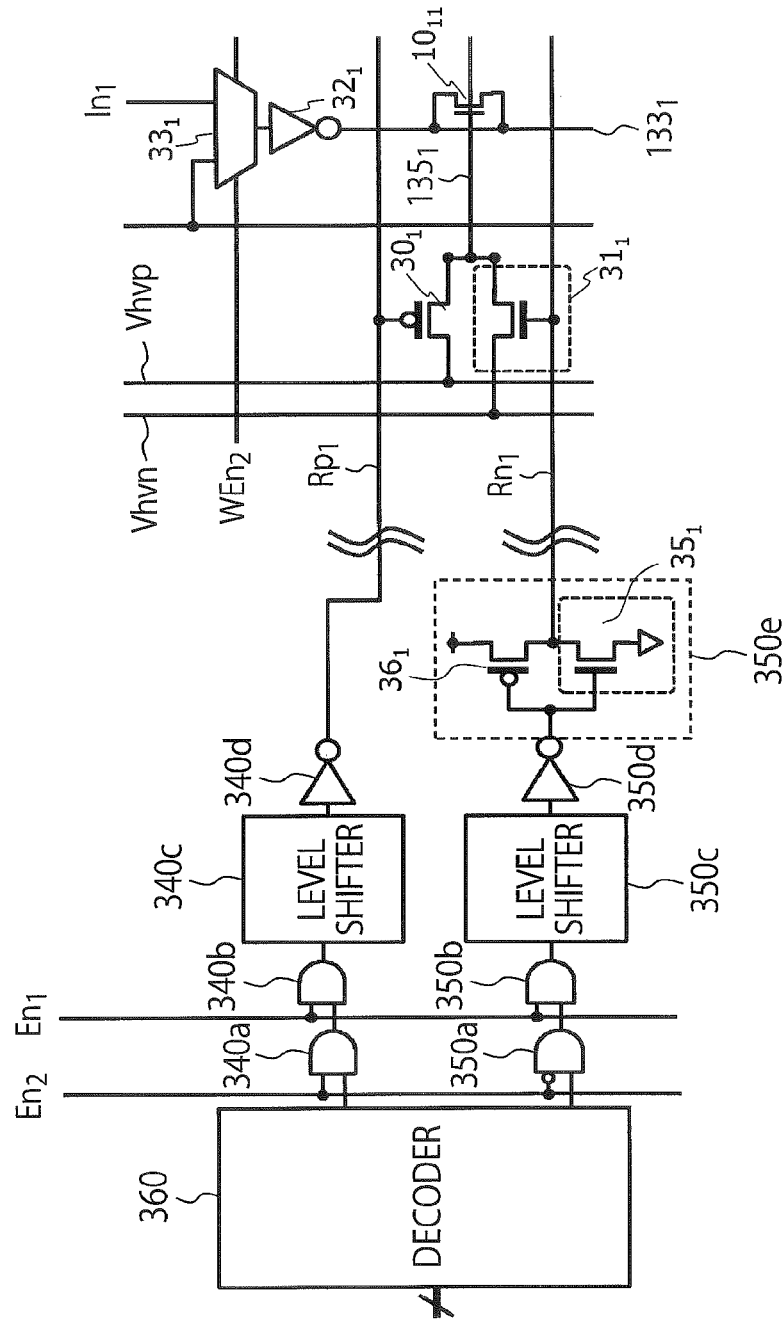
FIG. 20 is a circuit diagram of a specific example of the drivers shown in FIG. 19.

A specific example of the drivers, for example the fourth driver 340 and the fifth driver 350, is shown in FIG. 20. The fourth driver 340 and the fifth driver 350 include a decoder 360, an AND gate 340a, an AND gate 340b, a level shifter 340c, an inverter 340d, an AND gate 350a, an AND gate 350b, a level shifter 350c, an inverter 350d, and an inverter 350e.

The decoder 360 receives a selection address signal and outputs a decoded signal to the AND gate 340a and the AND gate 350a. The AND gate 340a performs an AND operation on the decoded signal from the decoder 360 and the enable signal $E_2$, and sends an operation result to the AND gate 340b. The AND gate 340b performs an AND operation on the signal from the AND gate 340a and the enable signal $En_1$, and sends an operation result to the level shifter 340c. The level shifter 340c shifts the level of the signal indicating the operation result of the AND gate 340b, and sends a shifted signal to the inverter 340d. The inverter 340d inverts the signal from the level shifter 340c and supplies an inverted signal as the signal $Rp_i$.

The AND gate 350a performs an AND operation on the decoded signal from the decoder 360 and a signal inverted from the enable signal $E_2$, and sends an operation result to the AND gate 350b. The AND gate 350b performs an AND operation on the signal from the AND gate 350a and the enable signal $En_1$, and sends an operation result to the level shifter 350c. The level shifter 350c shifts the level of the signal indicating the operation result of the AND gate 350b, and sends a shifted signal to the inverter 350d. The inverter 350d inverts the shifted signal and sends an inverted signal to the inverter 350e. The inverter 350e inverts the signal from the inverter 350d and sends an inverted signal as the signal $Rn_1$. The inverters 340d and 350d each have a configuration obtained by connecting a high breakdown voltage p-channel transistor and a high breakdown voltage n-channel transistor in series (not shown). The inverter 350e has a configuration obtained by connecting a high breakdown voltage p-channel transistor $36_1$ and a high breakdown voltage n-channel transistor $35_1$ formed on an independent well in series. In FIG. 20, a configuration for supplying a voltage to the signal $Rp_2$ and the signal $Rn_2$ is omitted.

In the data writing in the row direction, the data writing in the column direction, and the normal operation, the enable signal $En_1$ is at Vdd, for example. The enable signal $En_2$ is at Vdd in the data writing in the row direction, and at 0 V in the data writing in the column direction and the normal operation.

As described above, the semiconductor integrated circuits according to the second embodiment and the example of the second embodiment are capable of preventing a delay in operation speed even if OTP memory elements are used.

The semiconductor integrated circuit according any one of the embodiments is applied to a switch block (SB) of an FPGA.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
   first to fifth wiring lines;
   a first OTP memory element including a first terminal connected to the first wiring line and a second terminal connected to the second wiring line;
   a first p-channel transistor including a source terminal and a drain terminal, one of which is connected to the first wiring line and the other of which is connected to the third wiring line, and a gate terminal, which receives a first control signal;
   a first n-channel transistor including a source terminal and a drain terminal, one of which is connected to the first wiring line and the other of which is connected to the fourth wiring line, and a gate terminal, which receives a second control signal;
   a second p-channel transistor including a source terminal and a drain terminal, one of which is connected to the second wiring line and the other of which is connected to the third wiring line, and a gate terminal, which receives a third control signal; and
   a second n-channel transistor including a source terminal and a drain terminal, one of which is connected to the second wiring line and the other of which is connected to the fifth wiring line, and a gate terminal, which receives a fourth control signal.

2. The semiconductor integrated circuit according to claim 1, further comprising a selection circuit including a first input terminal, a second input terminal, and a first output terminal connected to the fifth wiring line, the selection circuit electrically connecting one of the first input terminal and the second input terminal to the first output terminal in accordance with an enable signal.

3. The semiconductor integrated circuit according to claim 1, wherein the first OTP memory element includes a MOS transistor, in which the first terminal is a gate terminal and the second terminal is source and drain terminals that are electrically connected to each other of the MOS transistor, or the first terminal is the source and drain terminals that are electrically connected each other and the second terminal is the gate terminal of the MOS transistor.

4. The semiconductor integrated circuit according to claim 1, further comprising a driver configured to:
   turn on the first p-channel transistor and the second n-channel transistor based on the first control signal and the fourth control signal, and turn off the first n-channel transistor and the second p-channel transistor based on the second control signal and the third control signal so as to set a potential applied to the third wiring line to be higher than a potential applied to the fifth wiring line to apply a write voltage between the third wiring line and the fifth wiring line, thereby writing data to the first OTP memory element; and
   turn on the first n-channel transistor and the second p-channel transistor based on the second control signal and the third control signal, and turn off the first p-channel transistor and the second n-channel transistor based on the first control signal and the fourth control signal so as to set the potential applied to the third wiring line to be higher than a potential applied to the fourth wiring line to apply a write voltage between the third wiring line and the fourth wiring line, thereby writing data to the first OTP memory element.

5. The semiconductor integrated circuit according to claim 1, further comprising:
   a sixth wiring line and a seventh wiring line;
   a second OTP memory element including a third terminal connected to the sixth wiring line and a fourth terminal connected to the second wiring line;
   a third p-channel transistor including a source terminal and a drain terminal, one of which is connected to the sixth wiring line and the other of which is connected to the third wiring line, and a gate terminal, which receives a fifth control signal; and
   a third n-channel transistor including a source terminal and a drain terminal, one of which is connected to the sixth wiring line and the other of which is connected to the seventh wiring line, and a gate terminal, which receives the second control signal.

6. The semiconductor integrated circuit according to claim 5, wherein when a write operation is performed on the second OTP memory element, the driver
   turns on the third p-channel transistor and the second n-channel transistor based on the fifth control signal and the fourth control signal, and turns off the third n-channel transistor and the second p-channel transistor based on the second control signal and the third control signal so as to set a potential applied to the third wiring line to be higher than a potential applied to the fifth wiring line to apply a write voltage between the third wiring line and the fifth wiring line, thereby writing data to the second OTP memory element and
   turns on the third n-channel transistor and the second p-channel transistor based on the second control signal and the third control signal and turns off the third p-channel transistor and the second n-channel transistor based on the fifth control signal and the fourth control signal so as to set the potential applied to the third wiring line to be higher than a potential applied to the seventh wiring line to apply a write voltage between the third wiring line and the seventh wiring line.

7. The semiconductor integrated circuit according to claim 5, wherein the second OTP memory element includes a MOS transistor, and wherein the third terminal is a gate terminal and the fourth terminal is the source and drain terminals that are electrically connected to each other of the MOS transistor, or the third terminal is the source and drain terminals that are electrically connected to each other and the fourth terminal is the gate terminal of the MOS transistor.

8. A semiconductor integrated circuit comprising:
first to fourth wiring lines;
a first OTP memory element including a first terminal connected to the first wiring line and a second terminal connected to the second wiring line;
a first p-channel transistor including a source terminal and a drain terminal, one of which is connected to the first wiring line and the other of which is connected to the third wiring line, and a gate terminal, which receives a first control signal; and
a first n-channel transistor including a source terminal and a drain terminal, one of which is connected to the first wiring line and the other of which is connected to the fourth wiring line, and a gate terminal, which receives a second control signal.

9. The semiconductor integrated circuit according to claim 8, further comprising a selection circuit including a first input terminal, a second input terminal, and a first output terminal electrically connected to the second wiring line, the selection circuit electrically connecting one of the first input terminal and the second input terminal to the first output terminal in accordance with an enable signal.

10. The semiconductor integrated circuit according to claim 8, wherein:
the first OTP memory element includes a MOS transistor in which the first terminal is a gate terminal and the second terminal is source and drain terminals that are electrically connected to each other of the MOS transistor, or
the first terminal is the source and drain terminals that are electrically connected to each other and the second terminal is the gate terminal of the MOS transistor.

11. The semiconductor integrated circuit according to claim 8, further comprising a driver configured to:
turn on the first p-channel transistor based on the first control signal, and turn off the first n-channel transistor based on the second control signal so as to set a potential applied to the third wiring line to be higher than a potential applied to the second wiring line to apply a write voltage between the third wiring line and the second wiring line, thereby writing data to the first OTP memory element; and
turn on the first n-channel transistor based on the second control signal and turn off the first p-channel transistor based on the first control signal so as to set a potential applied to the fourth wiring line to be lower than the potential applied to the second wiring line to apply a write voltage between the fourth wiring line and the second wiring line, thereby writing data to the first OTP memory element.

12. The semiconductor integrated circuit according to claim 8, further comprising:
a fifth wiring line;
a second OTP memory element including a third terminal connected to the fifth wiring line and a fourth terminal connected to the second wiring line;
a second p-channel transistor including a source terminal and a drain terminal, one of which is connected to the fifth wiring line and the other of which is connected to the third wiring line, and a gate terminal, which receives a third control signal; and
a second n-channel transistor including a source terminal and a drain terminal, one of which is connected to the fifth wiring line and the other of which is connected to the fourth wiring line, and a gate terminal, which receives a fourth control signal.

13. The semiconductor integrated circuit according to claim 12, wherein when a write operation is performed on the second OTP memory element, the driver
turns on the second p-channel transistor based on the third control signal, and turns off the second n-channel transistor based on the fourth control signal so as to set a potential applied to the third wiring line to be higher than a potential applied to the second wiring line to apply a write voltage between the third wiring line and the second wiring line, thereby writing data to the second OTP memory element, and
turns on the second n-channel transistor based on the fourth control signal and turns off the second p-channel transistor based on the third control signal so as to set a potential applied to the fourth wiring line to be lower than the potential applied to the second wiring line to apply a write voltage between the fourth wiring line and the second wiring line, thereby writing data to the second OTP memory element.

14. The semiconductor integrated circuit according to claim 12, wherein the second OTP memory element includes a MOS transistor, in which the third terminal is a gate terminal and the fourth terminal is source and drain terminals that are electrically connected to each other of the MOS transistor, or the third terminal is the source and drain terminals that are electrically connected to each other and the fourth terminal is the gate terminal of the MOS transistor.

* * * * *